(12) United States Patent
Kinnune et al.

(10) Patent No.: US 9,222,632 B2
(45) Date of Patent: Dec. 29, 2015

(54) LED LIGHTING FIXTURE

(71) Applicant: Cree, Inc., Durham, NC (US)

(72) Inventors: Brian Kinnune, Racine, WI (US);
Nathan Snell, Raleigh, NC (US);
Jeremy Sorenson, Oak Creek, WI (US)

(73) Assignee: Cree, Inc., Durham, NC (US)

( * ) Notice: Subject to any disclaimer, the term of this patent is extended or adjusted under 35 U.S.C. 154(b) by 88 days.

(21) Appl. No.: 13/764,736

(22) Filed: Feb. 11, 2013

(65) Prior Publication Data

US 2014/0211470 A1    Jul. 31, 2014

Related U.S. Application Data

(63) Continuation-in-part of application No. 29/444,511, filed on Jan. 31, 2013.

(51) Int. Cl.
*F21S 8/08* (2006.01)
*F21V 29/00* (2015.01)
(Continued)

(52) U.S. Cl.
CPC .............. *F21S 8/086* (2013.01); *F21V 29/507* (2015.01); *F21V 29/74* (2015.01); *F21V 21/116* (2013.01); *F21V 23/045* (2013.01); *F21V 29/89* (2015.01); *F21W 2131/103* (2013.01); *F21W 2131/40* (2013.01); *F21Y 2101/02* (2013.01);
(Continued)

(58) Field of Classification Search
CPC ....... F21K 9/50; F21V 29/505; F21V 29/507;
F21V 29/74; F21V 29/89; F21V 21/116;
F21V 23/045; F21S 8/086; F21W 2131/103;
F21W 2131/40; F21Y 2101/02; H01L
25/0753; H01L 33/54

USPC .................. 362/244, 245, 247, 248, 294, 373
See application file for complete search history.

(56) References Cited

U.S. PATENT DOCUMENTS 1,225,301 A    5/1917    Wolfe
3,184,199 A    5/1965    Clark et al.
(Continued)

FOREIGN PATENT DOCUMENTS

DE    9417326 U1    2/1995
JP    10268800 A    10/1998

OTHER PUBLICATIONS

International Search Report for PCT patent application serial No. PCT/US08/05854, dated Aug. 18, 2008 (1 page).
(Continued)

*Primary Examiner* — Alan Cariaso
(74) *Attorney, Agent, or Firm* — Jansson Munger McKinley & Kirby Ltd.

(57) ABSTRACT

An LED light fixture including a frame defining a forward open region and a rearward region with a rearmost portion adapted for securement to a support member. An LED assembly is secured with respect to the frame and positioned within the open forward region with open spaces remaining therebetween. The LED assembly includes an LED illuminator secured with respect to the LED-supporting region of a heat sink with an LED-supporting region and heat-dissipating surfaces extending therefrom. Another aspect of the invention is a non-metallic frame defining a forward open region and having a rearward region having a rearmost portion adapted for securement to a support member. An LED assembly is secured with respect to the frame and positioned within the open forward region with open spaces remaining therebetween.

43 Claims, 24 Drawing Sheets

(51) Int. Cl.
*F21V 29/507* (2015.01)
*F21V 29/74* (2015.01)
F21V 21/116 (2006.01)
F21W 131/103 (2006.01)
F21W 131/40 (2006.01)
F21Y 101/02 (2006.01)
F21V 23/04 (2006.01)
H01L 25/075 (2006.01)
H01L 33/54 (2010.01)
F21V 29/89 (2015.01)

(52) U.S. Cl.
CPC ............ *H01L25/0753* (2013.01); *H01L 33/54* (2013.01); *H01L 2924/0002* (2013.01)

(56) References Cited

U.S. PATENT DOCUMENTS

| | | |
|---|---|---|
| 3,652,047 A | 3/1972 | Starr |
| 4,167,033 A | 9/1979 | Fletcher |
| 4,254,453 A | 3/1981 | Mouyard et al. |
| 4,264,946 A | 4/1981 | Faux et al. |
| 4,426,676 A | 1/1984 | Taylor |
| 4,787,019 A | 11/1988 | Van Den Broeke et al. |
| 4,793,581 A | 12/1988 | Bilson et al. |
| 5,136,493 A | 8/1992 | Straus et al. |
| 5,274,250 A | 12/1993 | Miyake et al. |
| 5,617,131 A | 4/1997 | Murano et al. |
| 5,711,890 A | 1/1998 | Hawkins et al. |
| 5,796,154 A | 8/1998 | Sano et al. |
| 5,896,288 A | 4/1999 | Lecheler et al. |
| 5,984,494 A | 11/1999 | Chapman et al. |
| 6,045,239 A | 4/2000 | Waldmann et al. |
| 6,056,254 A | 5/2000 | Albright et al. |
| 6,155,701 A | 12/2000 | Leen |
| 6,325,524 B1 | 12/2001 | Weber et al. |
| 6,357,895 B1 | 3/2002 | Kierulf et al. |
| 6,414,343 B1 | 7/2002 | Kondo et al. |
| 6,502,956 B1 | 1/2003 | Wu |
| 6,630,736 B1 | 10/2003 | Ignaut |
| 6,635,911 B2 | 10/2003 | Maruyama |
| 6,635,941 B2 | 10/2003 | Suda |
| 6,730,940 B1 | 5/2004 | Steranka et al. |
| 6,837,605 B2 | 1/2005 | Reill |
| 6,871,993 B2 * | 3/2005 | Hecht ............................ 362/555 |
| 6,876,008 B2 | 4/2005 | Bhat et al. |
| 6,893,941 B2 | 5/2005 | Suda |
| RE38,767 E | 8/2005 | Wedell et al. |
| 6,959,996 B2 | 11/2005 | Ip |
| 6,969,946 B2 | 11/2005 | Steranka et al. |
| 6,972,439 B1 | 12/2005 | Kim et al. |
| 7,009,213 B2 | 3/2006 | Camras et al. |
| 7,019,334 B2 | 3/2006 | Yatsuda et al. |
| 7,078,258 B2 | 7/2006 | Sakoh et al. |
| 7,080,932 B2 | 7/2006 | Keuper |
| 7,102,185 B2 | 9/2006 | Nichols et al. |
| 7,141,825 B2 | 11/2006 | Horio et al. |
| 7,176,070 B2 | 2/2007 | Lee et al. |
| 7,182,480 B2 | 2/2007 | Kan |
| 7,281,818 B2 | 10/2007 | You et al. |
| 7,461,952 B2 * | 12/2008 | Trenchardl et al. ........... 362/294 |
| 7,530,711 B2 | 5/2009 | Bang |
| 7,543,953 B2 | 6/2009 | Chapman |
| 7,566,147 B2 | 7/2009 | Wilcox et al. |
| 7,591,567 B2 | 9/2009 | Wilcox et al. |
| 7,637,624 B2 | 12/2009 | Chin |
| 7,637,630 B2 | 12/2009 | Wilcox et al. |
| 7,637,633 B2 * | 12/2009 | Wong ............................ 362/294 |
| 7,651,245 B2 * | 1/2010 | Thomas et al. ................ 362/294 |
| 7,654,691 B2 | 2/2010 | Liu et al. |
| 7,686,469 B2 | 3/2010 | Ruud et al. |
| 7,703,939 B2 | 4/2010 | Wilcox et al. |
| 7,744,247 B2 * | 6/2010 | Zhang et al. ............. 362/249.02 |
| 7,758,211 B2 * | 7/2010 | Zheng et al. ............. 362/249.02 |
| 7,938,558 B2 | 5/2011 | Wilcox et al. |
| 8,021,026 B2 | 9/2011 | Liu et al. |
| 8,061,869 B2 * | 11/2011 | Lo ............................ 362/249.02 |
| 8,067,778 B2 * | 11/2011 | Bae et al. ........................ 257/98 |
| 8,070,306 B2 | 12/2011 | Ruud et al. |
| 8,092,042 B2 | 1/2012 | Wilcox |
| 8,092,049 B2 | 1/2012 | Kinnune et al. |
| 8,104,933 B2 | 1/2012 | Liu et al. |
| 8,313,221 B2 * | 11/2012 | Hsu ............................... 362/373 |
| 8,393,764 B2 * | 3/2013 | Yao ............................... 362/373 |
| D681,250 S | 4/2013 | Ruffalo et al. |
| 8,425,086 B2 * | 4/2013 | Chen et al. ..................... 362/294 |
| 2004/0156209 A1 | 8/2004 | Ishida |
| 2004/0251469 A1 | 12/2004 | Yatsuda et al. |
| 2006/0158080 A1 | 7/2006 | Nakano et al. |
| 2006/0169878 A1 | 8/2006 | Kasano et al. |
| 2006/0175626 A1 | 8/2006 | Wall, Jr. |
| 2006/0176686 A1 | 8/2006 | McVicker |
| 2006/0187671 A1 | 8/2006 | Coushaine et al. |
| 2007/0070625 A1 | 3/2007 | Bang |
| 2007/0097684 A1 | 5/2007 | Obara et al. |
| 2009/0296403 A1 | 12/2009 | Zhang et al. |
| 2010/0195323 A1 | 8/2010 | Schaefer et al. |
| 2010/0238671 A1 | 9/2010 | Catone et al. |
| 2011/0013397 A1 | 1/2011 | Catone et al. |
| 2011/0095690 A1 | 4/2011 | Sagal |
| 2011/0188233 A1 | 8/2011 | Josefowicz et al. |
| 2011/0222284 A1 | 9/2011 | Kong et al. |
| 2011/0310603 A1 * | 12/2011 | Simons ........................ 362/235 |
| 2012/0025711 A1 | 2/2012 | Best et al. |
| 2012/0099317 A1 * | 4/2012 | Liu ............................ 362/249.02 |
| 2012/0099319 A1 * | 4/2012 | Liu ............................ 362/249.02 |
| 2012/0162987 A1 * | 6/2012 | Liu et al. ................. 362/249.02 |
| 2012/0281404 A1 | 11/2012 | Wilcox et al. |
| 2013/0250574 A1 * | 9/2013 | Moriyama et al. ............ 362/237 |
| 2014/0049961 A1 | 2/2014 | Wilcox et al. |

OTHER PUBLICATIONS

Philips Lumec, Roadstar Series brochure. Date: 2009. 26 pages.
Philips Group, Lumec Head Office, 640 Cure-Boivin Boulevard, Boisbriand, Quebec, Canada J7G 2A7.
Philips Lumec, Roadstar Luminaire brochure. 43 pages.
Philips Roadway Lighting. Product Brochure. Date: Copyright 2010. 12 pages.
Light News. Date: Nov. 2010. 8 pages. Electron AG, Bereich Lichttechnik, Riedhofstrasse 11, CH-8804 Au Zh.

* cited by examiner

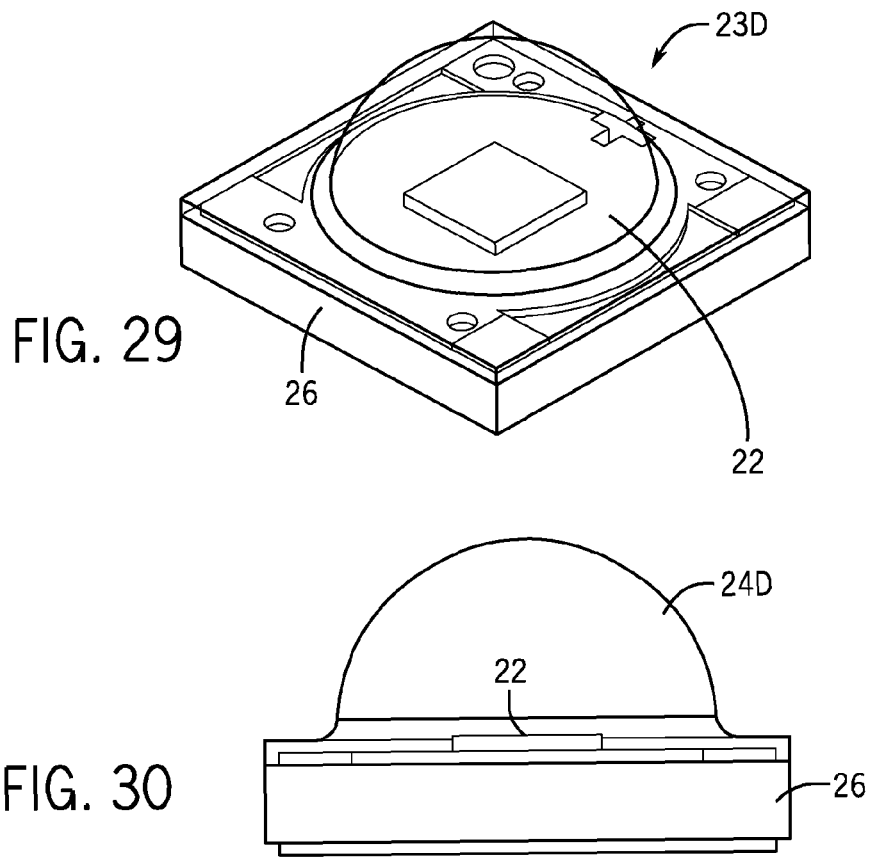
FIG. 29
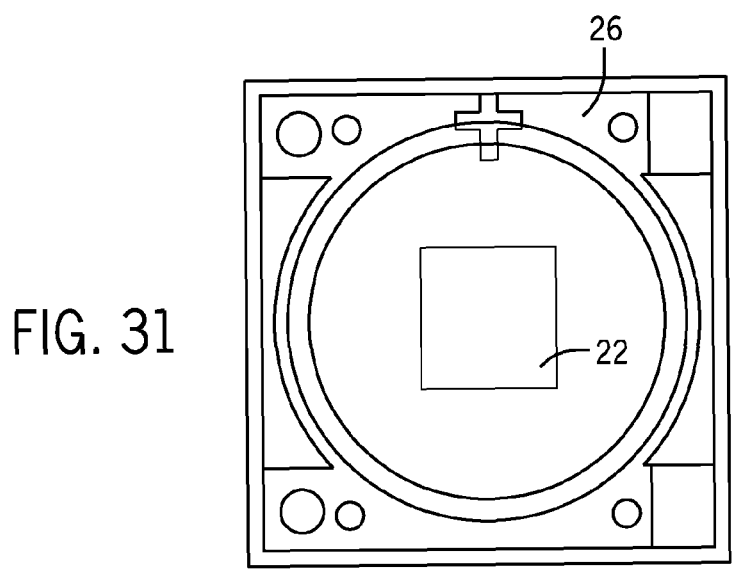
FIG. 30
FIG. 31

LED LIGHTING FIXTURE

RELATED APPLICATION

This application is a continuation-in-part of patent application Ser. No. 29/444,511, filed Jan. 31, 2013. The entirety of the contents of application Ser. No. 29/444,511 is incorporated herein by reference.

FIELD OF THE INVENTION

This invention relates to light fixtures and, more particularly, to light fixtures using light-emitting diodes (LEDs).

BACKGROUND OF THE INVENTION

In recent years, the use of light-emitting diodes (LEDs) in development of light fixtures for various common lighting purposes has increased, and this trend has accelerated as advances have been made in the field. Indeed, lighting applications which previously had typically been served by fixtures using what are known as high-intensity discharge (HID) lamps are now being served by LED light fixtures. Such lighting applications include, among a good many others, roadway lighting, factory lighting, parking lot lighting, and commercial building lighting.

High-luminance light fixtures using LED modules as light source present particularly challenging problems. One particularly challenging problem for high-luminance LED light fixtures relates to heat dissipation. Among the advances in the field are the inventions of U.S. Pat. Nos. 7,686,469 and 8,070,306.

Improvement in dissipating heat to the atmosphere is one significant objective in the field of LED light fixtures. It is of importance for various reasons, one of which relates to extending the useful life of the lighting products. Achieving improvements without expensive additional structure and apparatus is much desired. This is because a major consideration in the development of high-luminance LED light fixtures for various high-volume applications, such as roadway lighting, is controlling product cost even while delivering improved light-fixture performance.

In summary, finding ways to significantly improve the dissipation of heat to the atmosphere from LED light fixtures would be much desired, particularly in a fixture that is easy and inexpensive to manufacture.

SUMMARY OF THE INVENTION

The present invention relates to improved LED lighting fixtures. In certain embodiments, the LED lighting fixture includes a frame and an LED assembly secured with respect to the frame. The frame defines a forward open region and a rearward region. The rearward region has a rearmost portion adapted for securement to a support member. The LED assembly is positioned within the open forward region with open spaces remaining between the LED assembly and the frame. The LED assembly includes an LED illuminator secured with respect to an LED-supporting region of a heat sink with heat-dissipating surfaces extending from the LED-supporting region. In certain embodiments, the heat sink and the frame are formed as a single piece.

The fixture may also have an enclosure which is within the rearward region and defines a chamber enclosing electronic LED power circuitry. In some of such embodiments, the enclosure has upper and lower shells.

In certain embodiments, the upper shell and the frame are formed as a single piece. In some of such embodiments, the heat sink, the upper shell and the frame are formed as a single piece. The single piece may be a metal casting.

In some versions, the lower shell is movably secured with respect to the upper shell. In some of such versions, the lower shell is a one-piece polymeric structure. This allows the LED power circuitry to include an antenna which is fully enclosed within the chamber along with circuitry for wireless control of the fixture.

In some embodiments, the heat sink is open to ambient-fluid flow and includes a central portion and peripheral portions. The central portion includes the LED-supporting region. The peripheral portions have peripheral heat-dissipating surfaces along lateral sides of the heat sink.

The central portion may have a plurality of fins protruding in a direction opposite the LED illuminator. In some of such embodiments, the heat sink includes at least one central-portion opening facilitating ambient-fluid flow to and from the heat-dissipating surfaces of the central portion. The fins of the central portion may define between-fin channels open at the front ends of such fins. In some embodiments, the rear ends of such fins are configured to permit ambient-fluid flow (e.g., water drainage) from the between-fin channels to the at least one central-portion opening, thereby facilitating liquid drainage therefrom. The at least one central-portion opening may be adjacent to the enclosure.

In some embodiments, the LED-supporting region of the heat sink has a surface opposite the LED illuminator, i.e., the surface from which the fins of the central portion of the heat sink project, which is especially adapted to facilitate liquid drainage. In some of such embodiments, when the fixture is mounted in its usual use orientation, such surface slopes downwardly toward at least two of the sides of the heat sink, thereby facilitating liquid drainage in such side directions. Such surface may slope downwardly toward at least three of the sides of the heat sink and, in some embodiments, the surface slopes downwardly toward each of four sides of the heat sink In those embodiments in which the surface opposite the LED illuminator includes fins projecting therefrom, the surface opposite the LED illuminator includes between-fin surfaces. Such between-fin surfaces, when the fixture is its usual use orientation, are inclined off-horizontal, thereby to facilitate liquid drainage from between such fins.

In some embodiments, the LED assembly may have a circular plan-view configuration, and the surface opposite the LED illuminator, i.e., the top surface of the heat sink may be curved or domed in a manner facilitating drainage in multiple directions therefrom.

In some embodiments, the peripheral heat-dissipating surfaces include a plurality of fins extending laterally from the central portion of the heat sink with open spaces between such fins. The central portion may have a plurality of fins extending forwardly therefrom with open spaces between the fins.

In certain of such embodiments that have fins extending laterally from the central portion of the heat sink and other fins extending forwardly from the central portion of the heat sink, the heat sink is an extrusion which has been extruded in a direction orthogonal to both the forward and lateral directions. The extruded dimension of the heat sink is much less than the forward-rearward and side-to-side dimensions of the heat sink. In some versions of such embodiments, the central portion of the extrusion includes walls with inner surfaces defining a central opening in the extrusion, and in some of such versions the heat sink includes, in addition to the extrusion, a mounting plate in thermal contact with the extrusion, the LED illuminator being secured to the mounting plate.

In certain embodiments, the electronic LED power circuitry includes a caseless LED driver, the components of which are encapsulated in a protective polymeric material. Such driver may be removably secured to the upper shell.

The LED illuminator may include an LED emitter on a circuit board and an LED optical member over the emitter. The LED emitter may have an array of LED light sources spaced along the circuit board. The LED optical member may have a plurality of lenses each over a corresponding one of the LED light sources. Each LED light source may include an array of LEDs.

In another aspect of the present invention, the LED light fixture includes a non-metallic frame defining a forward open region and having a rearward region with a rearmost portion adapted for securement to a support member. An LED assembly is secured with respect to the frame and positioned within the open forward region with open spaces remaining therebetween. The LED assembly includes an LED illuminator secured with respect to an LED-supporting region of a heat sink which has heat-dissipating surfaces extending from the LED-supporting region.

The non-metallic frame may include upper and lower shells, and the rearward region of such frame may itself define a chamber enclosing electronic LED power circuitry. The non-metallic frame may be of a polymeric material. In such embodiments, the LED power circuitry may include an antenna which is fully enclosed within the chamber along with circuitry for wireless control of the fixture.

In accordance with certain aspects of the present invention, alternative embodiments of the LED lighting system can comprise one or more of the following aspects. In some embodiments, the frame comprises a central portion (which may also be referred to as a core or spine) which has an integral heat sink, at least a portion of the housing that comprises at least one compartment for wiring and/or driver circuitry separate from the LED illuminator, and a mount. The frame further comprises a peripheral portion spaced from the central portion to provide a desired form factor, e.g., such as a cobrahead or other form factor, and/or additional heat sinking In some embodiments, the core has a plurality of compartments, where in some embodiments, at least one of the compartments provides isolation from the LED illuminator. In some embodiments, the heat sink is integrated with a compartment. For example, a heat sink surface can form a compartment wall. In some embodiments, the heat sink can form an integral backlight shield. In other embodiments, the heat sink can comprise a reflective backlight shield. In some embodiments, the core is formed from a single piece of die-cast metal. In some embodiments, the core comprises the top portion of the housing, and a compartment door of metal or a polymeric material provides access, such as 180 degree access, to the compartment(s) in the housing. In some embodiments the heat sink can comprise an extruded part with lateral fins.

In some embodiments, the central portion is integrated with the heatsink, supports the housing and provides mounting to a support member. A top and/or bottom enclosure(s), which can be in the form of a clamshell, engages the core to house electronic components of LED power circuitry.

In some embodiments, the top and/or bottom enclosure can form the peripheral portion of the frame and provide a desired form factor. The top and/or bottom enclosures can be made of metal and/or a polymeric material. In certain embodiments, by using a polymeric material, such as a plastic, nylon or polycarbonate, for the enclosure(s) or doors, the fixture may be able to integrate a fully-enclosed antenna for wireless control of the fixture and be able to provide electrical isolation that allows the use of a removable LED driver. One example of such removable driver is a caseless driver board which is fully encapsulated in a protective polymeric material providing electrostatic discharge (ESD) protection to the driver board which conducts heat away from the driver board during operation.

In some embodiments, the heat sink includes fins in the space between the heat sink and peripheral portions of the frame. In some embodiments, at least one thermal connection is provided between the heatsink and the peripheral portion of the frame in a space between the heat sink and the peripheral portion of the frame. In some embodiments, open through-spaces are provided on multiple axes, e.g., at least one on a side and at least one on the front or back.

In some embodiments, the core can be made at least in part of a polymeric material. In some embodiments, a polymeric mounting arrangement can be used to mount the lighting fixture to a pole. In some embodiments, the entire core is made of a polymeric material.

In some embodiments, a mounting arrangement is provided with an outside fulcrum which allows for a smaller aperture off the back and better clearance for the pole. In some embodiments, the fixture includes a fulcrum outside a fixture interior which provides advantages such as allowing a smaller aperture for a support-member entry into the fixture interior as well as easier access to the interior by providing more room for clearance of a compartment door.

The smaller entry aperture may eliminate the need for a splash guard which is typically required for UL listed outdoor light fixtures, while still providing for the possibility of a splash-guard arrangements.

In some embodiments, the enclosure(s), door and/or housing can be molded and can comprise an integral backlight shield or reflector.

In certain embodiments of the invention in which the frame defines forward and rearward regions of the fixture, the frame defines a projected forward-region area and the LED assembly is secured in the forward region with open space between the LED assembly and the frame. The LED assembly itself defines a projected LED-assembly area which is no more than about 75% of the projected forward-region area. In other words, the forward region of the fixture is quite open. In some of such embodiments, the projected LED-assembly area is no more than about 60% of the projected forward-region area.

The projected area of open space is at least about 50% of the projected LED-assembly area. In some embodiments, the projected area of open space is at least about 60% of the projected LED-assembly area, and in some the projected area of open space is about two-thirds of the projected LED-assembly area.

The openness aspect of this invention can be further described as follows, using reference to an illuminator plane defined by the LED illuminator (an imaginary plane) directly facing the area to be illuminated. The intersection of the LED assembly with the illuminator plane defines an LED-assembly area, and the intersection of the outer perimeter of the light fixture with the illuminator plane defines a fixture area.

Using such parameters, one or more through-spaces in the fixture area are such that total through-space area in the illuminator plane is at least about 15% of the fixture area; and in some embodiments the total through-space area in the illuminator plane is at least about 40% of the fixture area. Described differently, the total through-space area in the illuminator plane is at least about 50% of the LED-assembly area. In some embodiments, the total through-space area in the illuminator plane is at least about 60% of the LED-assembly area; and in some embodiments the total through-space area in the illuminator plane is about two-thirds of the projected LED-assembly area.

In some embodiments, the LED assembly has substantially straight opposite lateral sides in plan view. The open space may include substantially mirror-imaged areas on opposite lateral sides of the LED assembly. In certain of such embodiments, the frame has substantially curved outward edges defining the forward region in a footprint which is substantially similar in configuration to the footprint of so-called "cobrahead" non-LED light fixtures.

In some embodiments of the light fixture which in plan view has central and outward portions, the central portion includes (a) a housing enclosing LED power circuitry, (b) a heat sink secured with respect to the housing and supporting an LED illuminator and (c) a mount adapted for securement to a support member. In some of such embodiments, the outward portion defines an outer plan-view shape of the fixture and is secured to the central portion with through-space(s) between the central and outward portions.

In some embodiments, the through-space(s) is/are at least along the heat sink In some of such embodiments, the through-space(s) along the heat sink is/are on opposite sides thereof. There are may be at least two through-space(s), including at least one on each of the opposite sides of the heat sink In certain embodiments, the through-space(s) is/are along opposite sides of the central portion, at least portions of such through-space(s) beings along the housing. In some of such embodiments, the through-space(s) is/are along at least a portion of the housing.

The outward portion has an outer perimeter which in plan view may be substantially similar to the footprint of a cobrahead non-LED light fixture.

The term "ambient fluid" as used herein means air and/or water around and coming into contact with the light fixture.

The term "projected," as used with respect to various portions and areas of the fixture, refers to such portions and areas of the fixture in plan views.

As used herein in referring to portions of the devices of this invention, the terms "upward," "upwardly," "upper," "downward," "downwardly," "lower," "upper," "top," "bottom" and other like terms assume that the light fixture is in its usual position of use.

In descriptions of this invention, including in the claims below, the terms "comprising," "including" and "having" (each in their various forms) and the term "with" are each to be understood as being open-ended, rather than limiting, terms.

BRIEF DESCRIPTION OF THE DRAWINGS

FIG. 29 is an enlarged perspective of yet another example of an LED package which has a single LED on a submount with an overmolded hemispheric primary lens.

FIG. 30 is an enlarged side view of the LED package of FIG. 31.

FIG. 31 is an enlarged top plan view of the LED package of FIG. 31.

FIGS. 38A-40A are bottom plan views of yet other alternative embodiments of the invention.

DETAILED DESCRIPTION OF EXEMPLARY EMBODIMENTS

Figure 1:
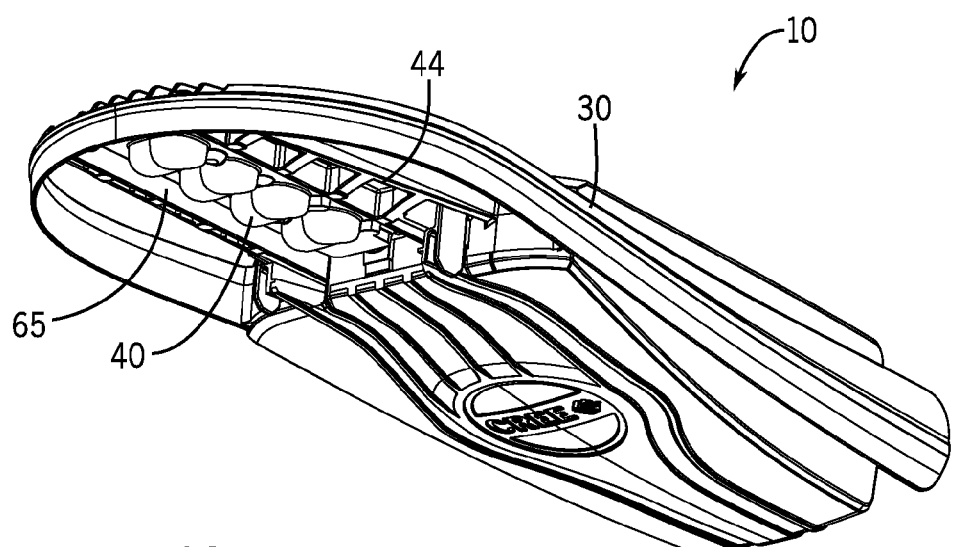
FIG. 1 is a perspective view from below of one embodiment of an LED light fixture in accordance with this invention.

The figures illustrate exemplary embodiments of LED light fixtures in accordance with this invention. Common or similar parts in different embodiments are given the same numbers in the drawings; the light fixtures themselves are often referred to by the numeral 10 followed by different letters with respect to alternative embodiments.

FIGS. 1-19, 32-33 and 35-37 illustrate a light fixture 10 which is a first embodiment in accordance with this invention. Light fixture 10 includes a frame 30 and an LED assembly 40 secured with respect to frame 30. Frame 30 surrounds and defines a forward open region 31 and a rearward region 32. Rearward region has a rearmost portion 33 adapted for securement to a support member 11. LED assembly 40 is positioned within open forward region 31 with open spaces 12 remaining therebetween—e.g., between either side of frame 30 and LED assembly 40. Other embodiments are possible where there are additional open spaces or one single open space.

Figure 5:
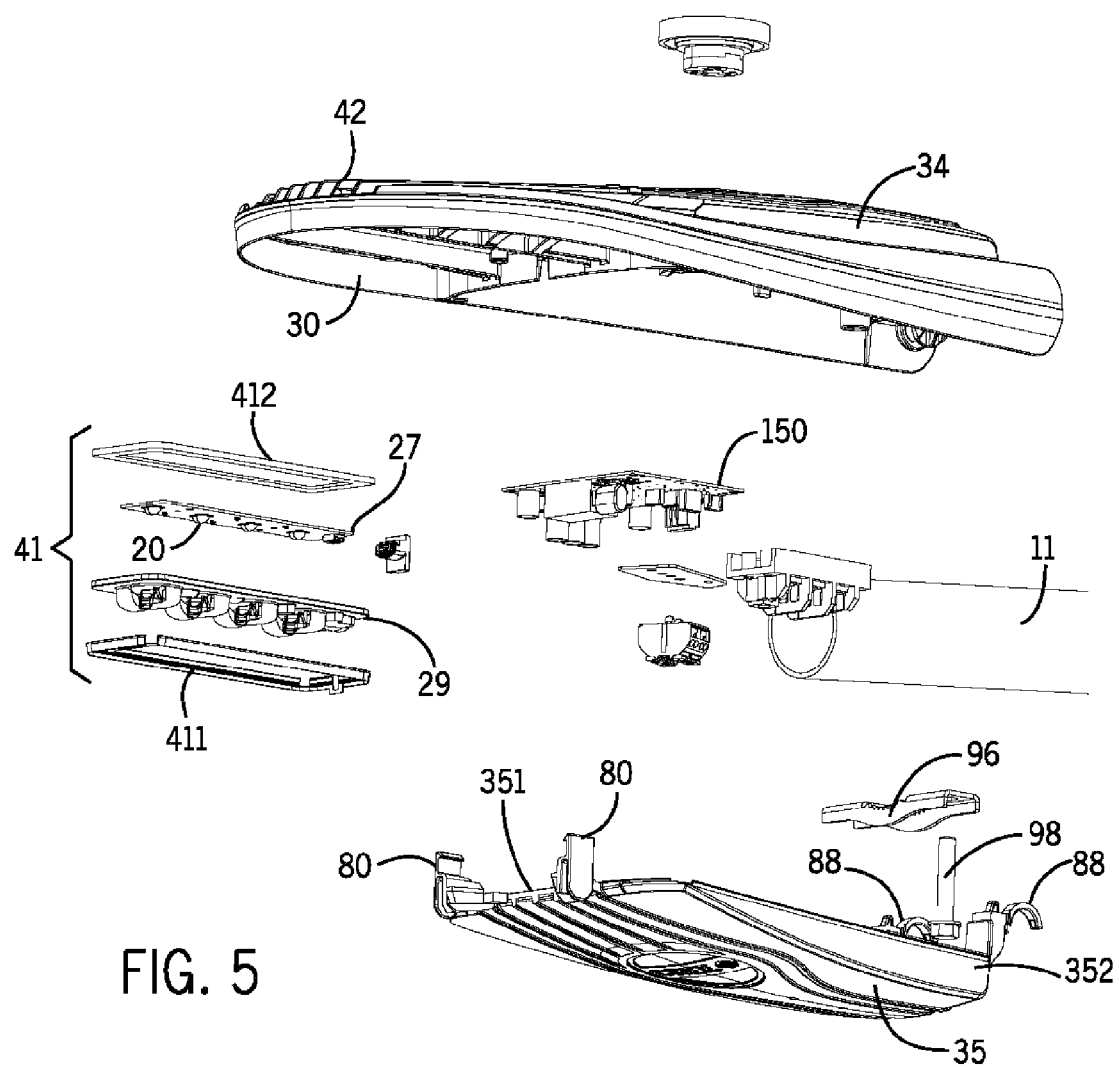
FIG. 5 is an exploded perspective view of the LED lighting of FIG. 1.

LED assembly 40 includes a heat sink 42 and an LED illuminator 41 secured with respect to heat sink 42. Heat sink 42 includes an LED-supporting region 43 with heat-dissipating surfaces 44 extending from LED-supporting region 43. LED illuminator 41 is secured with respect to LED-supporting region 43. As shown in FIG. 5, LED illuminator 41 includes a circuit board 27 with LED emitters 20 thereon and an optical member 29 over LED emitters 20 for illumination of areas below light fixture 10 (when fixture 10 is mounted in its usual use orientation).

FIGS. 27-31 show LED emitters in different forms among those usable in the present invention. Each LED emitter includes one or more light-emitting diodes (LED) 22 with a primary lens 24 thereover, forming what is referred to as LED package.

Figure 27:
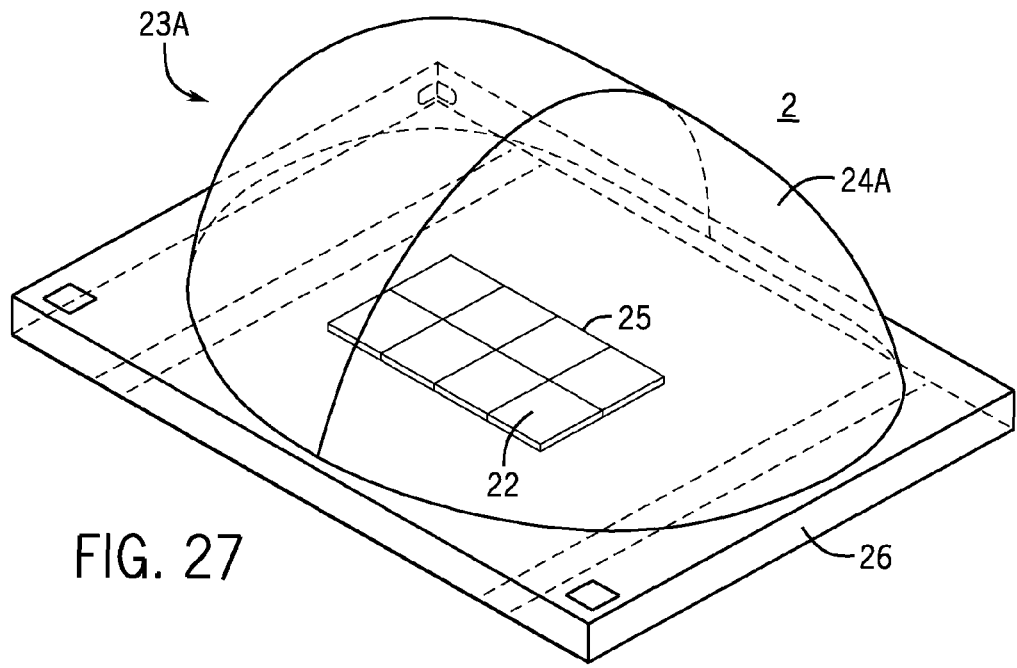
FIGS. 27 and 28 are enlarged perspective views of two examples of LED packages usable in LED light fixtures of this invention, the LED packages including different arrays of LEDs on a submount with an asymmetric primary lens overmolded on the LED arrays.
Figure 28:
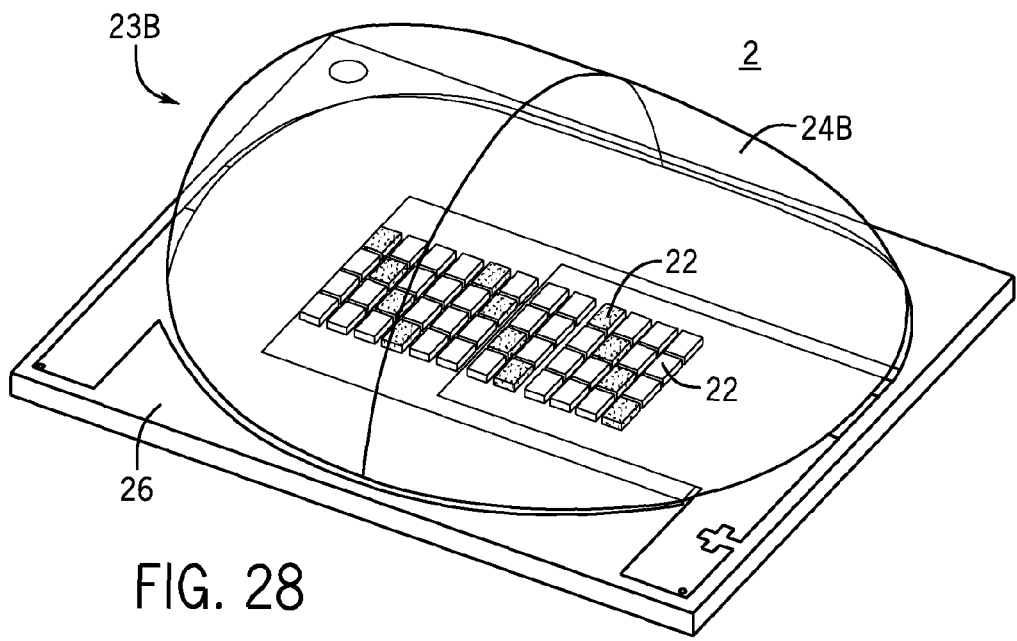

FIGS. 27 and 28 illustrate exemplary LED packages 23A and 23B each including an array of LEDs 22 on an LED-populated area 25 which has an aspect ratio greater than 1, and primary lenses 24 being overmolded on a submount 26 over LED-populated area 25. It is seen in FIG. 28 that the array may include LEDs 22 emitting different-wavelength light of different colors such as including red LEDs along with light green or other colors to achieve natural white light. Light emitters of the type as LED packages 23A and 23B are described in detail in patent application Ser. No. 13/441,558, filed on Apr. 6, 2012, and in patent application Ser. No. 13/441,620, filed on Apr. 6, 2012. Contents of both applications are incorporated herein by reference in their entirety.

FIGS. 27 and 28 also illustrate versions of LED light emitters configured to refract LED-emitted light toward a preferential direction 2. In each LED package 23A and 23B, each LED array defines emitter axis. FIGS. 27 and 28 illustrate primary lens 24A configured to refract LED-emitted light toward preferential side 2. It should be understood that for higher efficiency LED emitter may have a primary lens having its centerline offset from the emitter axis and also being shaped for refraction of LED-emitted light toward preferential side 2. In FIGS. 27 and 28, primary lens 24A is asymmetric.

FIGS. 29-31 show LED package 23D with a single LED 22 on a submount 26 and a hemispheric primary lens 24D coaxially overmolded on submount 26 over LED 22.

In fixtures utilizing a plurality of emitters, a plurality of LEDs or LED arrays may be disposed directly on a common submount in spaced relationship between the LEDs or LED arrays each of which is overmolded with a respective primary lens. These types of LED emitters are sometimes referred to as chip-on-board LEDs. LED optical member 29 is a secondary lens placed over the primary lens. In embodiments with a plurality of LED emitters (packages), optical member 29 includes a plurality of lenses 28 each positioned over a respective one of the primary lenses. The plurality of secondary lenses 28 are shown molded as a single piece 29 with a single flange surrounding each of the plurality of lenses 28.

FIG. 5 also illustrates LED illuminator 41 including a securement structure which includes rigid peripheral structure 411 which applies force along the circuit-board peripheral area toward heat sink 42. This structure serves to increase thermal contact across the facing area of the thermal-engagement surface of circuit board 27 and the surface of heat sink 42 which receives circuit board 27. This arrangement helps remove heat from LED emitters 20 during operation by increasing surface-to-surface contact between the thermal-engagement surface of the circuit board and the heat sink by facilitating excellent, substantially uniform thermal communication from the circuit board to the heat sink, thereby increasing heat transfer from the LEDs to the heat sink during operation. Rigid peripheral structure 411 may lm ay be a drawn sheet-metal single-piece structure. As shown in FIG. 5, a gasket 412 is sandwiched between optical member 29 and heat sink 42, thereby facilitating fluid-tight sealing of the circuit board 27. The securement structure is described in detail in patent application Ser. No. 61/746,862, filed Dec. 28, 2012, the entire contents of which are incorporated herein by reference.

Figure 21:
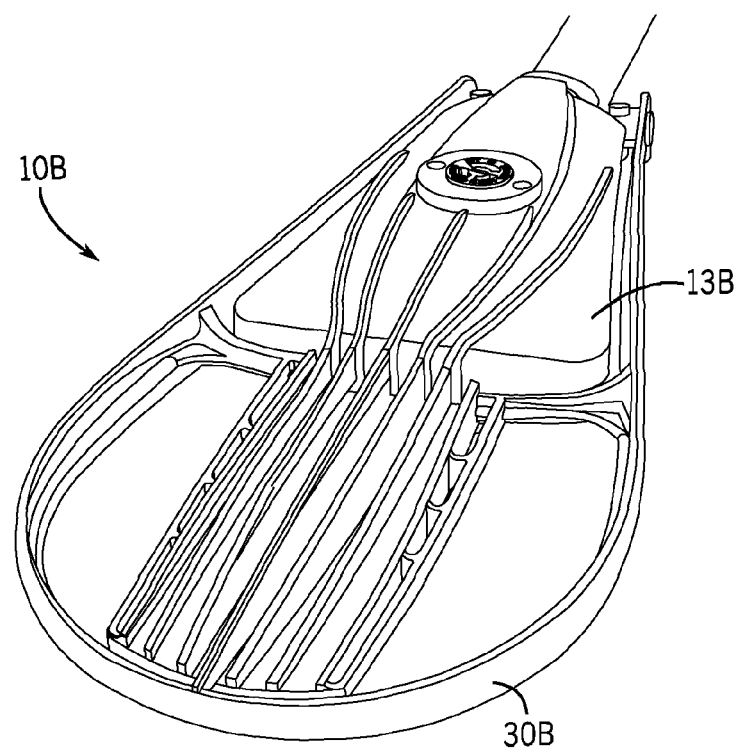
FIG. 21 is a front top perspective view of another alternative embodiment of this invention.
Figure 22:
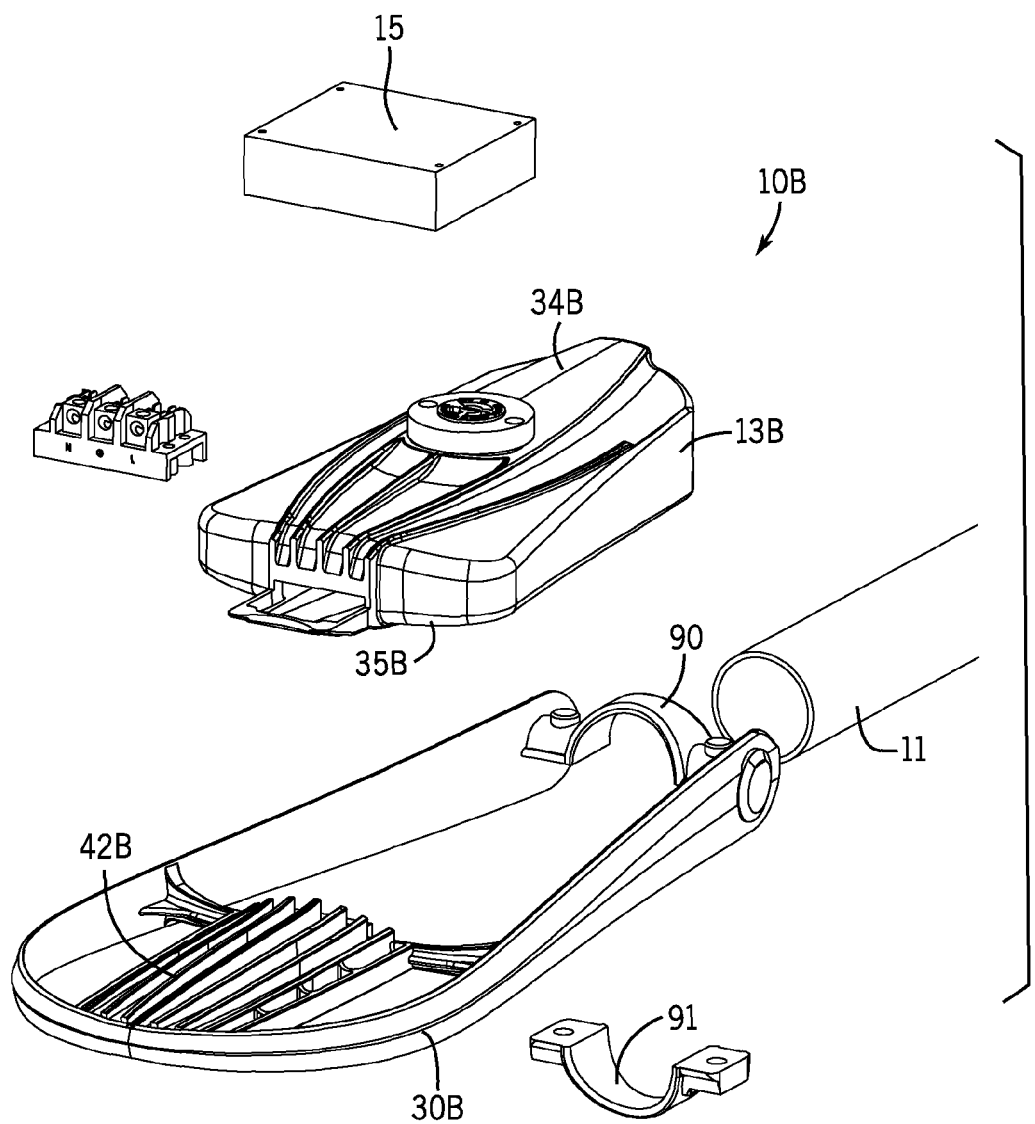
FIG. 22 is an exploded perspective view of the LED light fixture of FIG. 21.

LED light fixture 10 has a housing 17 and LED assembly 40 is secured with respect to housing 17. Housing 17 has an enclosure 13 which is within rearward region 32 and defines a chamber 14 enclosing electronic LED power circuitry 15. As shown in FIGS. 5-7, 9 and 17, enclosure 13 has an upper shell 34 and a lower shell 35. Lower shell 35, which is a one-piece polymeric structure, is movably secured with respect to upper shell 34, which is a metal structure. In various embodiments of the invention, including the first embodiment (which is shown in FIGS. 1-19, 32-33 and 35-37), a second embodiment which is shown in FIG. 20, and a third embodiment which is shown in FIGS. 21 and 22, the heat sink and the frame are formed as a single piece by metal casting. In the first and second of these embodiments, the frame, the heat sink and the upper shell are all formed as a single piece by metal casting.

Figure 6:
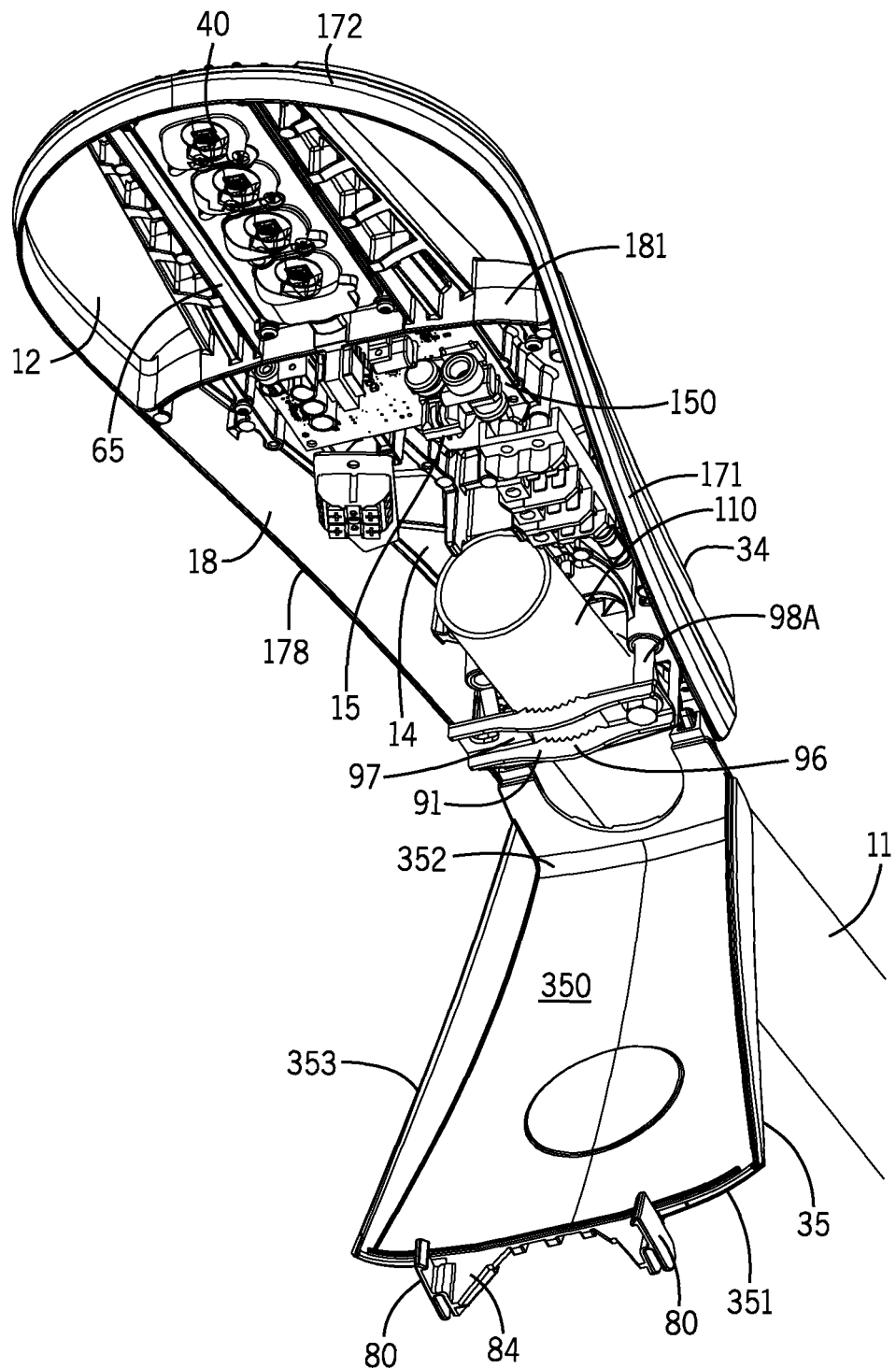
FIG. 6 is another perspective view showing a front of the LED light fixture from below with open cover member and secured to a support member.
Figure 7:
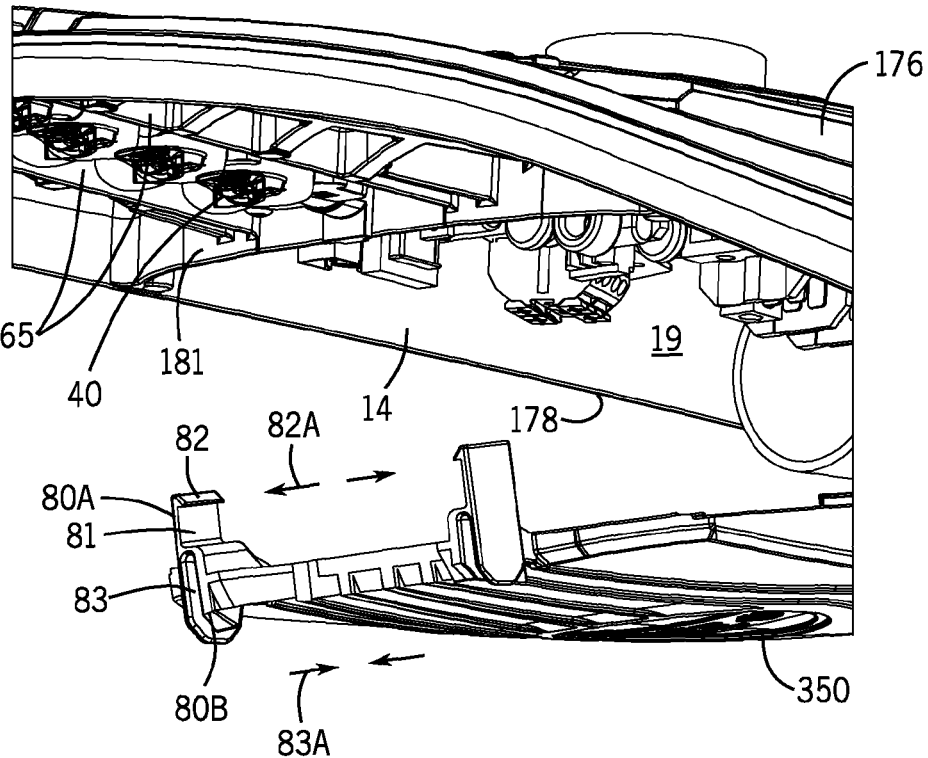
FIG. 7 is a fragmentary perspective view showing the disengaged forward end of the cover member with an integrated latching member.

FIGS. 6 and 7 illustrate electronic LED power circuitry 15 within chamber 14. Such LED power circuitry includes a caseless LED driver 150 which is removably secured to the inner surface of upper shell 34. Driver components of caseless LED driver 150 are encapsulated (potted) in a protective polymeric material prior to installation in the fixture such that Driver 150 is readily replaceable and does not have any potting applied during or after installation in the fixture. Suitable examples of such protective polymeric encapsulating material include thermoplastic materials such as low-pressure injection-molded nylon, which amply protect driver 150 from electrostatic discharge while conducting heat to upper shell 34 to facilitate cooling of the driver during operation.

With lower shell 35 being of polymeric material, a wireless signal can be received by the antenna which is fully enclosed within chamber 14 along with circuitry for wireless control of the fixture. Such circuitry with the antenna may be included as part of LED driver 150. The advantage of the fully enclosed antenna is also available on other embodiments of this invention having enclosures, all or portions of which are non-metallic material.

Housing 17 includes a main portion 171 which includes upper shell 34 and lower shell 35 and also includes a forward portion 172 extending forwardly from main portion 171. (Forward portion 172 of housing 17 is the forward portion of frame 30.) In main portion 171, upper shell 34 forms a housing body 176 and lower shell 35 serves as a cover member 350 movably secured with respect to housing body 176.

As shown in FIGS. 6-10 and 17, housing body 176 of the first embodiment has a main wall 170 (the upper portion of upper shell 34) and a surrounding wall 18 extending downwardly therefrom to a housing-body edge 178. Surrounding wall 18 has two opposed lateral wall-portions 180 extending between a forward heat-sink-adjacent wall-portion 181 and a rearward wall-portion 182. Cover member 350 has a forward end 351 and a rearward end 352. FIGS. 6, 8, 9 and 17 show rearward end 352 hingedly secured with respect to rearward wall-portion 182 of housing body 176.

The nature of the hinging securement is seen in FIGS. 3-6, 8, 9, 15, 18 and 19. In particular, polymeric lower shell 35 has an integral hinging member 87 in snap engagement with rearmost portion 33 of frame 30. Hinging member 87 has a pair of engaging portions 88, and the flexibility of the polymeric material of lower shell 35 permits snap engagement of each engaging portion 88 with rearmost portion 33 of frame 30 for secure pivoting thereabout. This provides secure connection of lower shell 35 portion with upper shell 34, allowing lower shell 35 to hang safely in open position during servicing of light fixture 10. In other words, the snap engagement of hinging member 87 with rearmost portion 33 allows controlled disengagement of lower shell 35 from upper shell 34.

Figure 8:
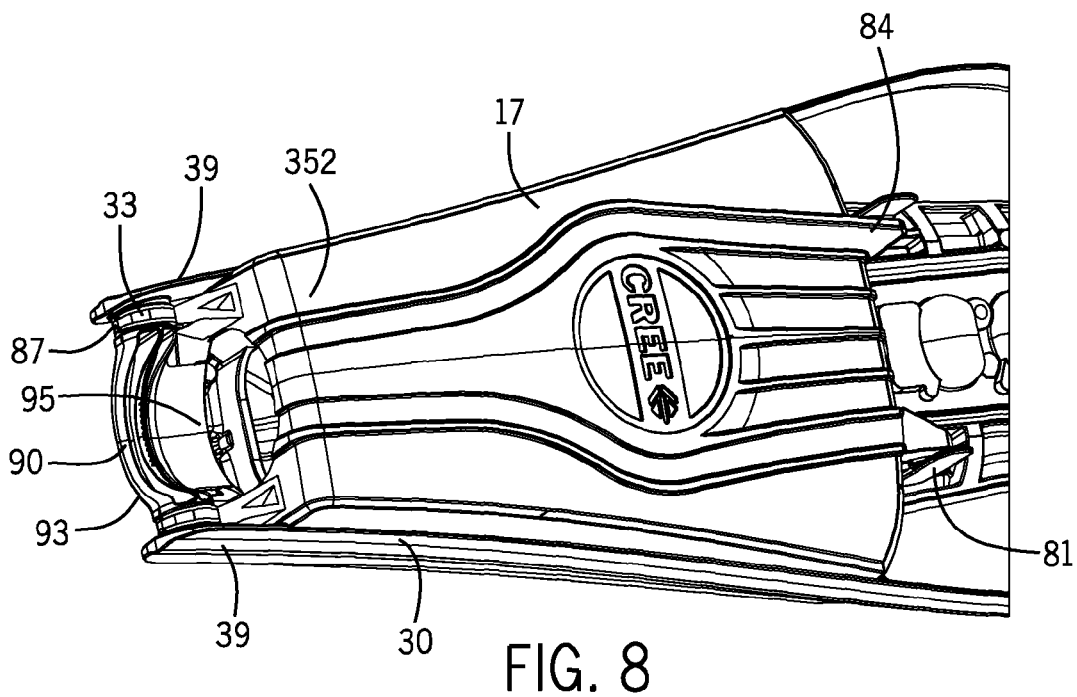
FIG. 8 is another fragmentary perspective view showing the rearward end of the cover member with an integrated hinging member.

As shown in FIGS. 5-7 and 9, forward end 351 of cover member 350 has an integrated latching member 80 detachably securing forward end 351 of cover member 350 with respect to forward wall-portion 181 of housing body 176, thereby closing chamber 14. As seen in FIGS. 6-8, cover member 350 has a cover edge 353 which is configured to engage housing-body edge 178.

FIGS. 5-7, 9 and 17 show that integrated latching member 80 includes a spring tab 81 with a hook 82 at one end 80A and a release actuator 83 at opposite end 80B. FIG. 7 shows hook 82 positioned and configured for locking engagement with respect to housing body 176. Release actuator 83 is configured such that force applied thereto in the direction of arrow 83A pivots hook 82 in opposite direction 82A sufficiently to release hook 82 from the locking engagement. This serves to detach forward end 351 of cover member 350 from housing body 176 to allow access to chamber 14. It should be understood that other suitable locking engagement between cover member 350 and housing body 176 may be possible.

As seen in FIGS. 1-4, 8, 11, 12, 18 and 19, hook 82 is positioned and configured for locking engagement with the one-piece casting. Integrated latching member 80 also includes a cover-member forward extension 84 extending beyond forward wall-portion 181 of housing-body surrounding wall 18. Spring tab 81 is supported by forward extension 84 such that hook 82 is positioned for locking engagement with heat sink 42. As seen in FIGS. 3, 11, 17 and 19, heat sink 42 has a protrusion 85 configured and positioned for locking engagement by hook 82.

Light fixture 10B of the third embodiment, shown in FIGS. 21 and 22 and which as indicated above includes frame 30B and heat sink 42B formed as a one-piece metal casting, has upper shell 34B and lower shell 35B both formed of polymeric material. The enclosure 13B which is formed by such polymeric shells is secured with respect to the metal casting of this embodiment.

Figure 23:
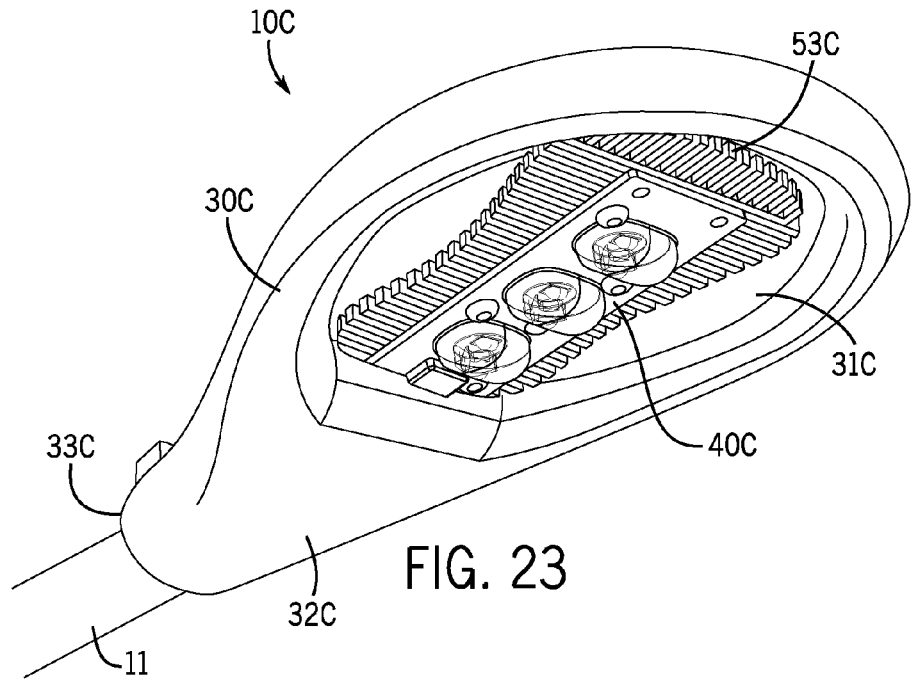
FIG. 23 is a bottom perspective view of yet another alternative embodiment of this invention.
Figure 24:
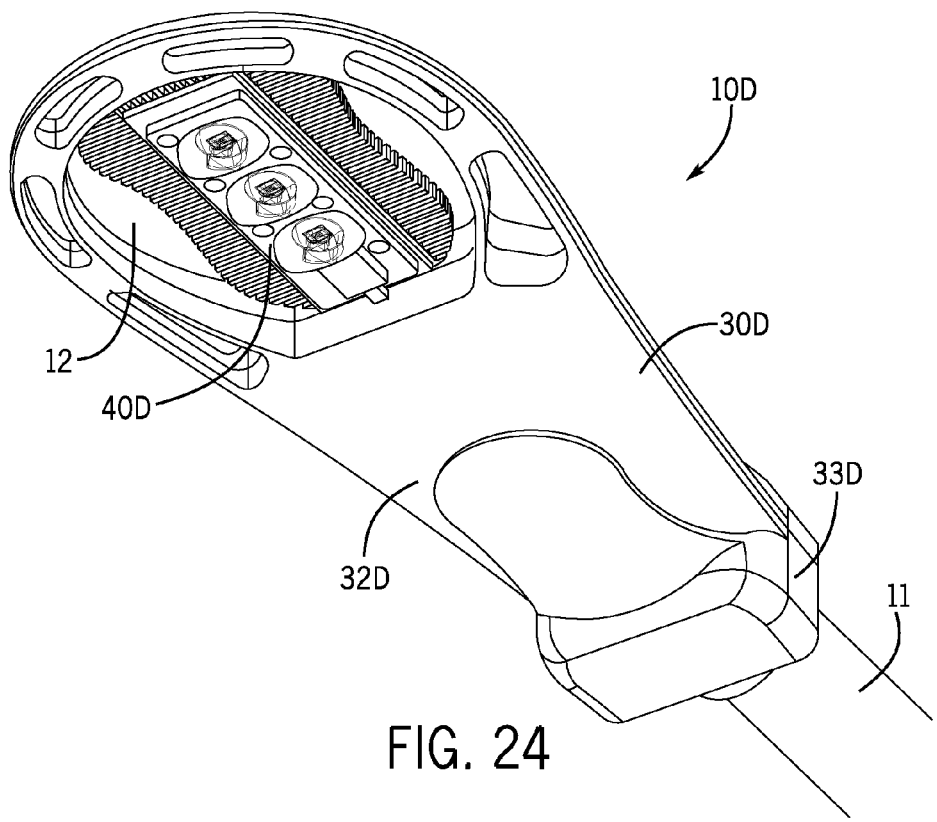
FIG. 24 is a bottom perspective view of still another embodiment of this invention.
Figure 25:
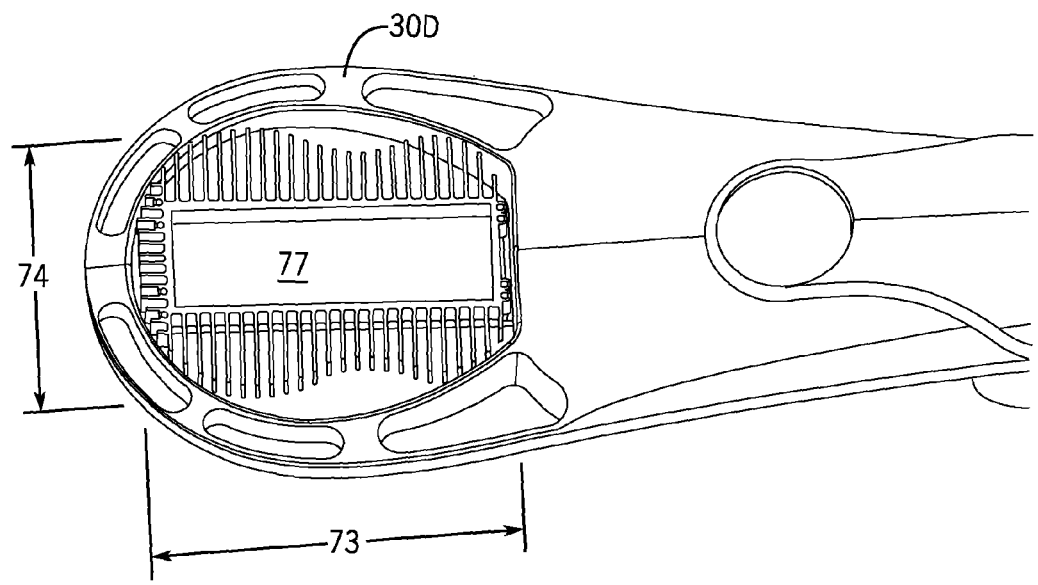
FIG. 25 is a bottom plan view showing the LED light fixture of FIG. 24 without its LED illuminator in place.
Figure 26:
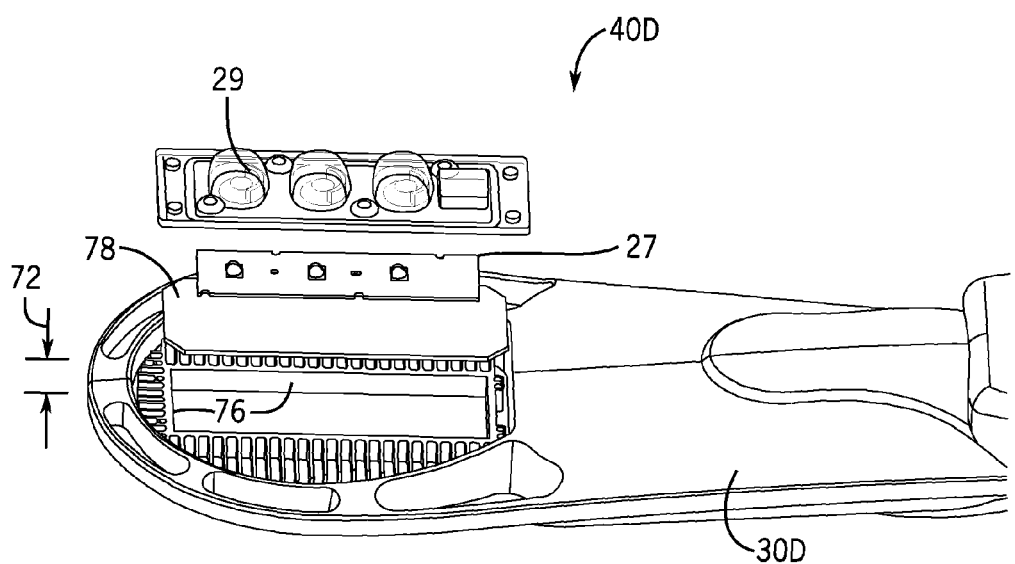
FIG. 26 is a bottom perspective partially-exploded view of the LED light fixture of FIG. 24.

A fourth embodiment of this invention is illustrated in FIGS. 23. In such embodiment, LED light fixture 10C has a non-metallic (polymeric) frame 30C. Frame 30C defines a forward open region 31C and has a rearward region 32C with a rearmost portion 33C adapted for securement to support member 11. FIGS. 24-26 illustrate a fifth embodiment of this invention. Light fixture 10D has an LED assembly 40D secured with respect to a non-metallic (polymeric) frame 30D. In the fourth and fifth embodiments, the frame itself serves to form the enclosure for the LED power circuitry, and such circuitry may include a fully-enclosed antenna.

The embodiments of FIGS. 23-26 each include extruded heat sinks which are characterized by having fins extending laterally on either side and forwardly on the front side. In each embodiment, the extruded heat sink has been extruded in a direction orthogonal to both the forward and the lateral directions. The extruded dimension, which is illustrated by numeral 72 in FIG. 26, is less than the forward-rearward and side-to-side dimensions 73 and 74 of such heat sink, as illustrated in FIG. 25. In some embodiments, the fins may be on at least three sides of the heat sink, as seen in FIGS. 34, 40, 38A and 39A. As seen in FIGS. 34, 38-39A, through-spaces 12 may be located along at least two of transverse sides of the heat sink, e.g., at least on one lateral side and on the front and rear sides of the heat sink The "short" extrusions of the heat sinks of the fourth and fifth embodiments are facilitated by structure shown best in FIGS. 25 and 26. More specifically, the heat sinks are each formed by an extrusion having a middle portion void, i.e., having walls 76 defining a central opening 77. As seen in FIG. 26, these heat sinks include, in addition to such extrusion, a mounting plate 78 in thermal contact with the extrusion. Mounting plate 78 may be thermally engaged to the extrusion by screws or in other ways. As shown in FIG. 26, LED illuminator 41 is secured to mounting plate 78.

The laterally- and forwardly-extending fins are open to free flow of ambient fluid (air and water), and their position and orientation serve to promote rapid heat exchange with the atmosphere and therefore rapid cooling of the LED illuminator during operation. Upwardly-flowing air and downwardly-flowing water (in the presence of precipitation) facilitate effective cooling, and reduce the need for upwardly-extending fins on top of the heat sinks.

Certain aspects are illustrated best by reference to the first embodiment, particularly as shown in FIGS. 1-7, 9-13, 17-26 and 34. Heat sink 42 of such embodiment has a front side 48, a rear side 49 and lateral sides 50 and is open to ambient-fluid flow to and from the various heat-dissipating surfaces 44. Heat sink 42 includes a central portion 45 and peripheral portions 46 along opposite lateral sides 50. Peripheral portions 46 have peripheral heat-dissipating surfaces 47 along lateral sides 50 of heat sink 42. Central portion 45 includes LED-supporting region 43 and has central heat-dissipating surfaces 51 opposite LED illuminator 41 from which a plurality of elongate fins 53 protrude in a direction opposite LED illuminator 41. Fins 53 extend from front fin-ends 54 adjacent to front side 48 of heat sink 42 to rear fin-ends 55 adjacent to rear side 49 of heat sink 42. As shown in FIGS. 3, 10, 16 and 19-22, some of rear fin-ends 55 are integral with housing 17.

FIGS. 3, 17, 19, 25 and 34 show central-portion openings 52 facilitating ambient-fluid flow to and from heat-dissipating surfaces 51 of central portion 45. central-portion openings 52 are adjacent to enclosure 13 and are partially defined by housing 17. Fins 53 of central portion 45 define between-fin channels 56 (shown in FIG. 13), which in a mounted position extend along a plane which is close to, but not, horizontal. Between-fin channels 56 are open at front fin-ends 54; i.e., there is no structural barrier to flow of liquid from between-fin channels 56 at front fin-ends 54.

Figure 3:
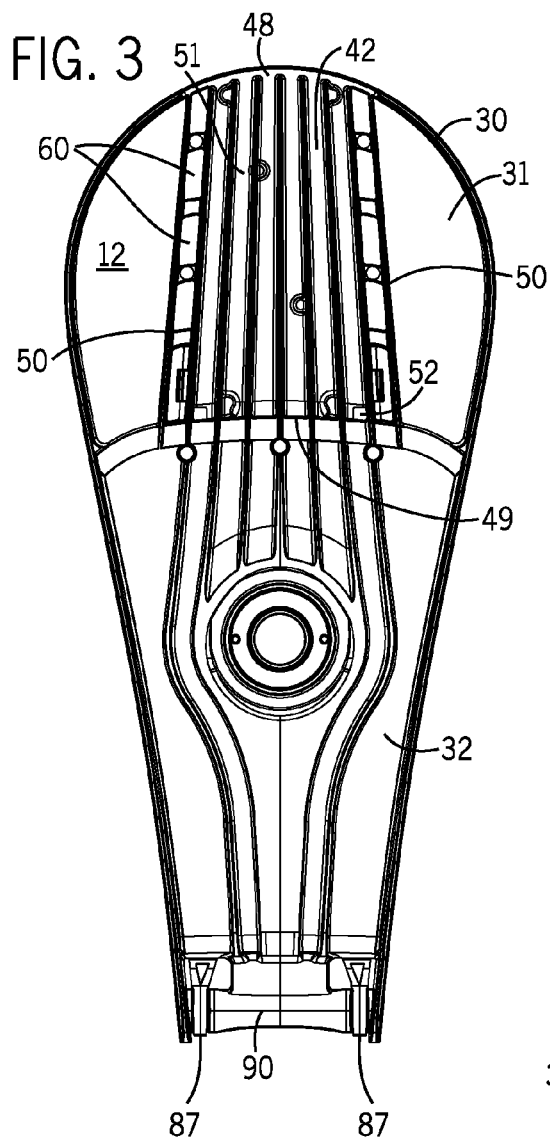
FIG. 3 is a top plan view of the LED light fixture of FIG. 1.
Figure 19:
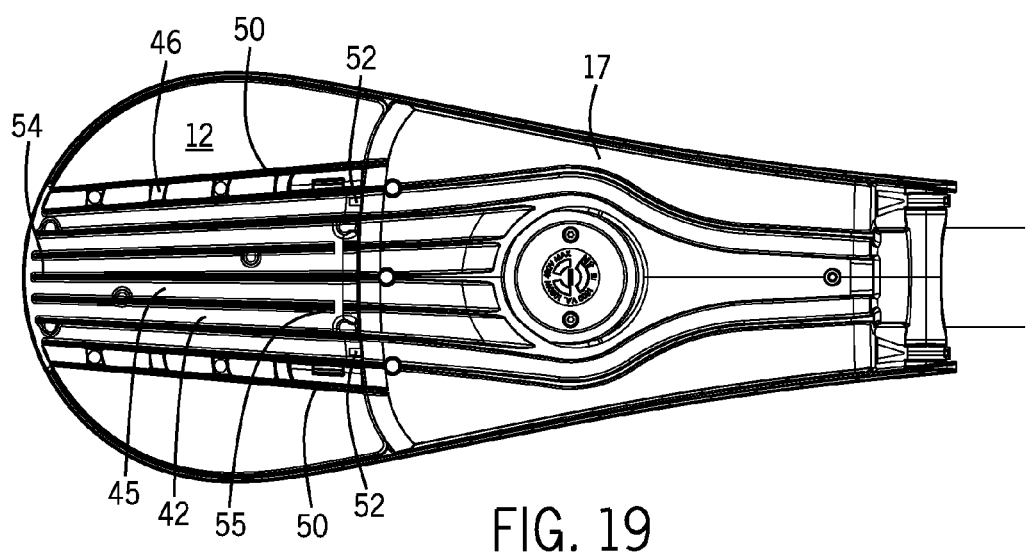
FIG. 19 is a top plan view of the LED light fixture secured to a support member.
Figure 20:
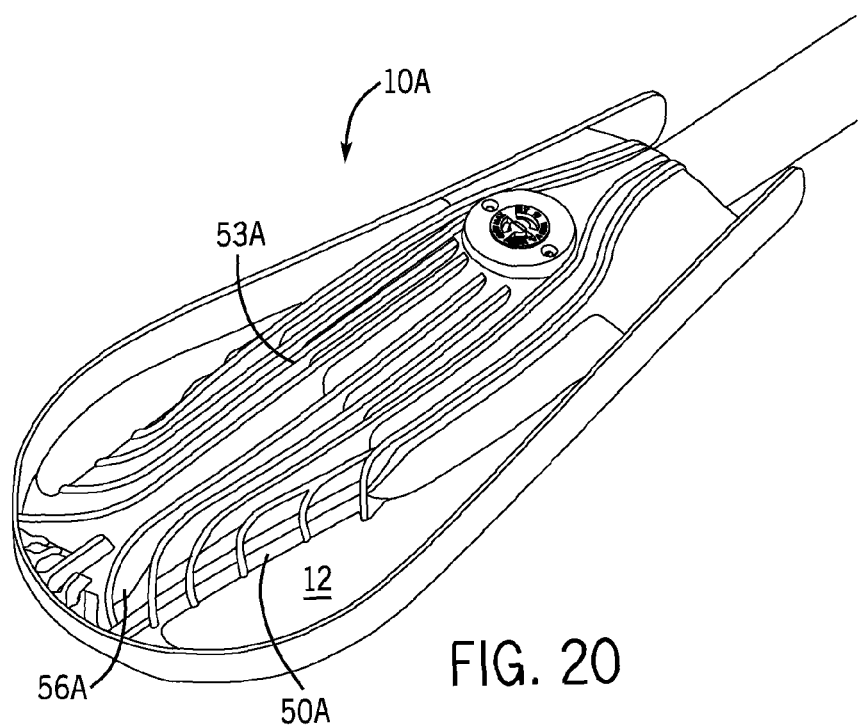
FIG. 20 is a top perspective view of an alternative embodiment of this invention.

In the second embodiment illustrated in FIG. 20, fins 53A are configured such that between-fin channels 56A are open along the front and lateral sides of the heat sink Referring again to the first embodiment, FIGS. 3 and 19 show rear fin-ends 55 configured to permit ambient-fluid flow from between-fin channels 56 to central-portion openings 52, thereby, facilitating liquid drainage therefrom. Liquid drainage from the top of heat sink 42 is facilitated by inclination of the top surface of heat sink 42, as explained more specifically below.

Figure 32:
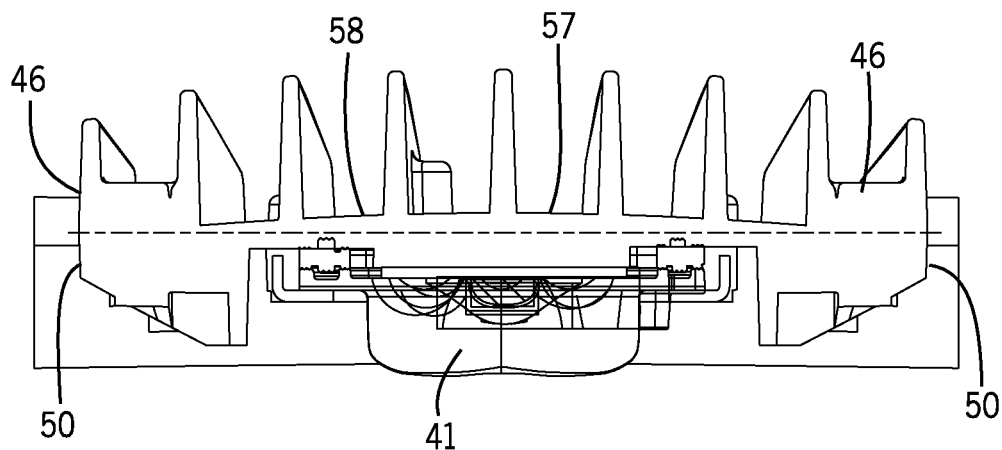
FIG. 32 is a fragmentary side-to-side cross-sectional view taken along section 32-32 as indicated in FIG. 3, illustrating the heat sink having a surface opposite the LED illuminator which slopes toward both lateral sides of the heat sink
Figure 33:
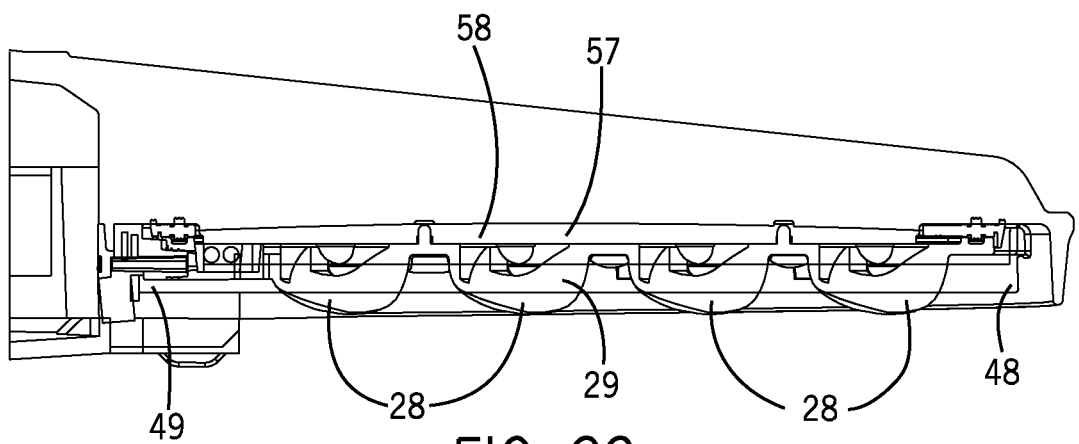
FIG. 33 is a fragmentary front-to-back cross-sectional view taken along section 33-33 as indicated in FIG. 3, illustrating the heat sink having a surface opposite the LED illuminator which slopes toward both the front and back sides of the heat sink
Figure 34:
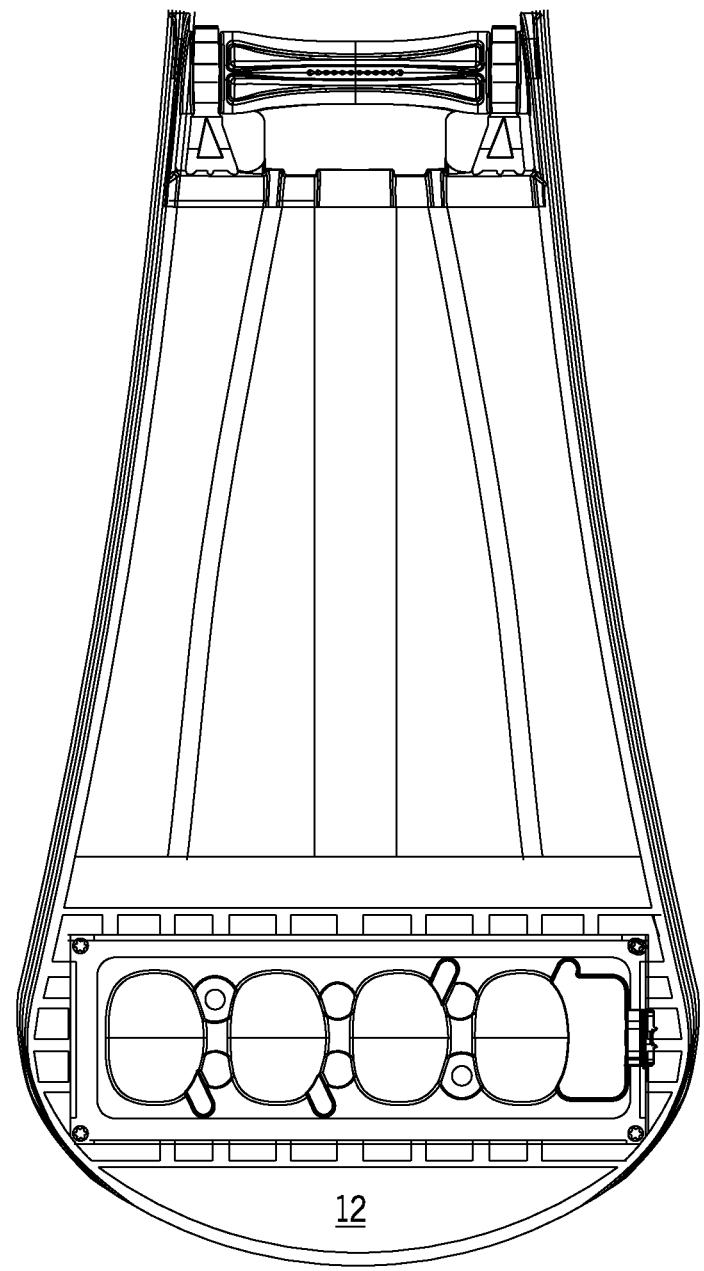
FIG. 34 is a bottom plan view of still another embodiment of the invention.

FIGS. 32 and 33 show between-fin surfaces 57 inclined off-horizontal when light fixture 10 is in its usual use orientation. More specifically, FIG. 32 shows surfaces 57 sloping toward lateral sides 50 of heat sink 42. FIG. 33 shows surfaces 57 sloping toward front and rear sides 48 and 49 of heat sink 42. In other words, portions of surfaces 57 are slightly but sufficiently downwardly inclined toward at least two dimensions and in this embodiment on each of the four sides of heat sink 42.

FIGS. 32 and 33 show LED assembly 40 on a bottom surface of heat sink 42. Heat sink 42, when the fixture is in its mounted orientation, includes a top surface which in plan view has a surrounding edge. FIGS. 32 shows the top surface sloping downwardly toward the surrounding edge in opposite lateral plan-view directions, thereby facilitating liquid drainage from the heat sink. FIGS. 33 shows the top surface sloping downwardly toward the surrounding edge in the forward and rearward directions. FIG. 32 further shows plurality of elongate fins 53 protruding from the top surface in a direction opposite LED illuminator 41. Sloping top surface includes between-fin surfaces 57.

Figure 2:
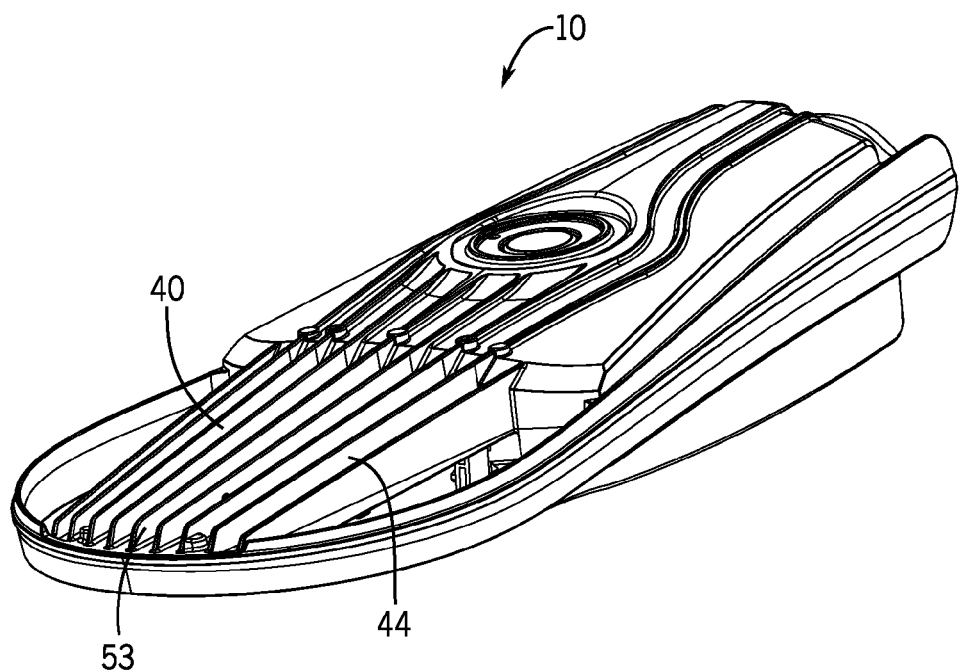
FIG. 2 is a perspective view from above of the LED light fixture of FIG. 1.
Figure 14:
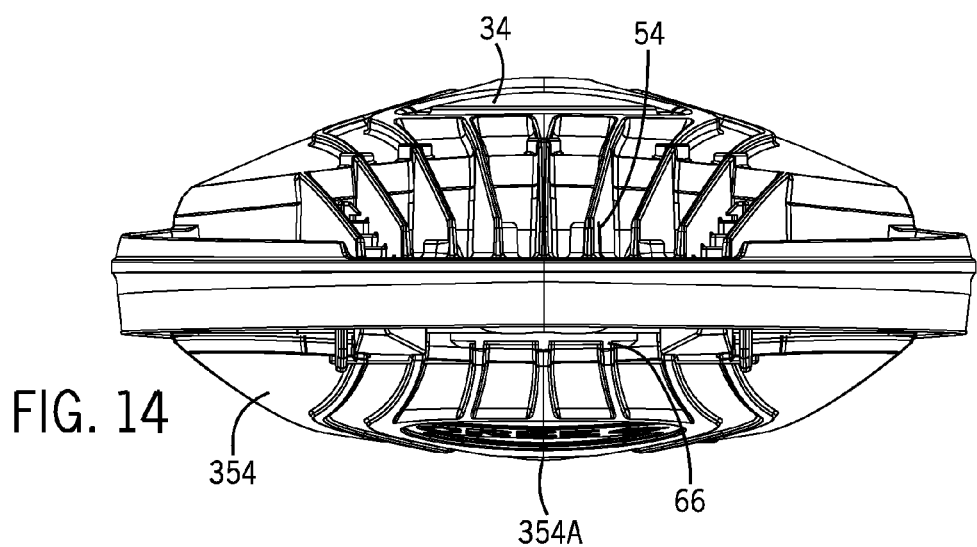
FIG. 14 is a front elevation of the LED light fixture of FIG. 1.
Figure 15:
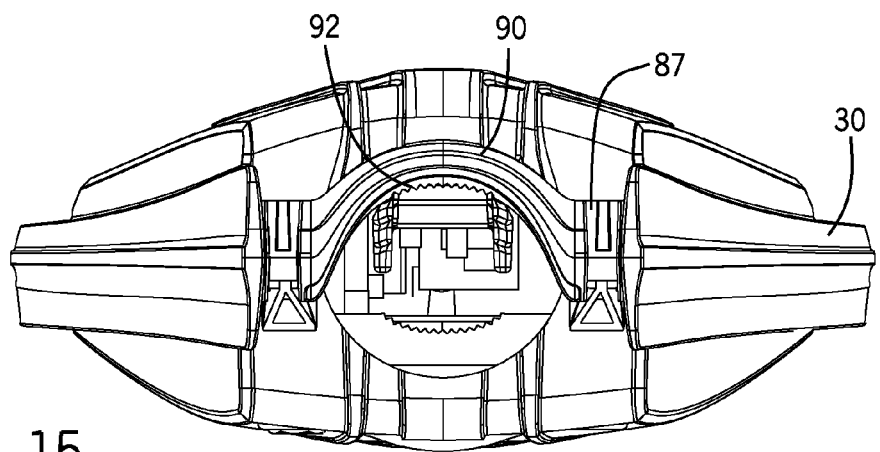
FIG. 15 is a rear elevation of the LED light fixture of FIG. 1.
Figure 16:
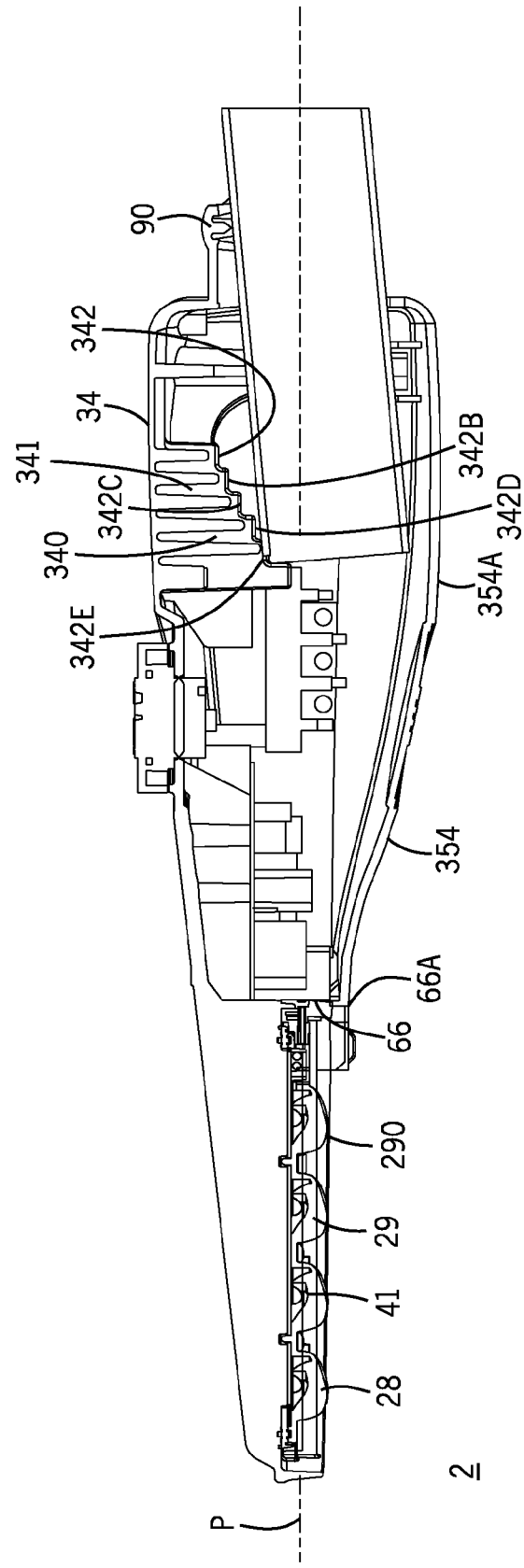
FIG. 16 is a side cross-sectional view of the LED light fixture taken along section 16-16 as indicated in FIG. 4.

FIGS. 2 and 16 show housing 17 including a housing top surface sloping downwardly in the forward direction. These figures also show the top housing surface sloping toward the top surface of heat sink 42, whereby liquid drainage from the housing facilitates cooling of heat sink 42. FIGS. 14 and 15 show the housing top surface sloping downwardly in opposite lateral plan-view directions, thereby facilitating liquid drainage therefrom.

Housing upper shell 34 and heat sink 42 are formed as a single piece, whereby the housing upper shell facilitates heat dissipation. The heat sink, the frame and the housing upper shell are formed as a single piece.

Figure 13:
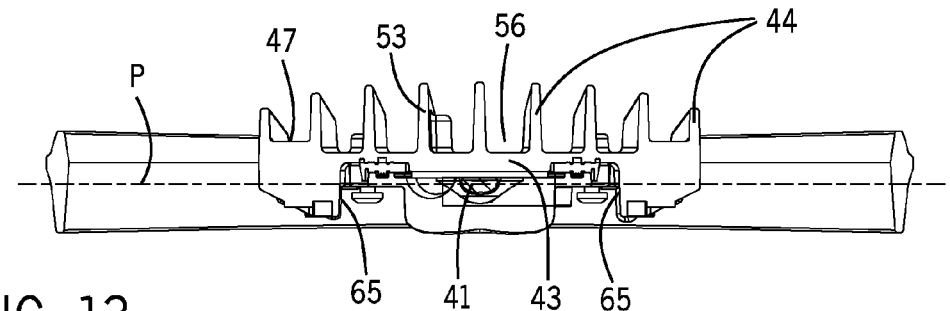
FIG. 13 is a side-to-side cross-sectional view of the LED light fixture taken along section 13-13 as indicated in FIG. 4.

In addition to the above-described sloping, LED light fixture 10 has various advantageous structural taperings. As seen best in FIGS. 3 and 4, heat sink 42, in plan view is tapered such that it is wider at its rearward end than at its forward end. Additionally, as seen in FIGS. 2 and 16, each of central-portion fins 53 has a tapered configuration such that its vertical dimension at the rearward end of heat sink 42 is greater than its vertical dimension at the forward end of heat sink 42. Furthermore, as seen in FIGS. 13 and 14, fins 53 have progressively lesser vertical dimensions toward each of opposite lateral sides 50 of heat sink 42.

As shown in FIGS. 1, 5, 6 and 11-13 and 32, peripheral portions 46 of heat sink 42 extend along opposite lateral sides 50. Peripheral heat-dissipating surfaces 47 include a plurality of fins 59 extending laterally from central portion 45 of heat sink 42, with open spaces 60 formed between adjacent pairs of fins 59. As seen in FIGS. 3, 4, 11-13 and 17-19, peripheral portion 46 also has a peripheral fin 59A along each lateral side 50 of heat sink 42. Peripheral fins 59A extend in length from front fin-ends 54A adjacent to front side 48 of heat sink 42 to rear fin-ends 55A adjacent to rear side 49 of heat sink 42. Rear fin-ends 55A of peripheral fins 59A are integral with housing 17. The configuration of peripheral portions 46 of heat sink 42 serve to facilitate cooling by providing additional heat-exchange surfaces in particular effective locations.

The various embodiments disclosed herein each illustrate one aspect of the present invention particularly related to the frame and open character of the fixtures. This is discussed in particular with respect to the first embodiment, and in particular with reference to FIGS. 35-37 which schematically illustrate "projected" areas of structure and through-spaces of the fixture in plan view.

More specifically, the first embodiment includes the following projected areas:

total area 36 of light-fixture forward region 31≈67.0 sq.in.;
total area 37 of LED assembly 40≈40.4 sq.in.;
total through-space area of the two lateral side voids 12≈26.5 sq.in.;
total area of the entire fixture≈160 sq. in.

Figure 35:
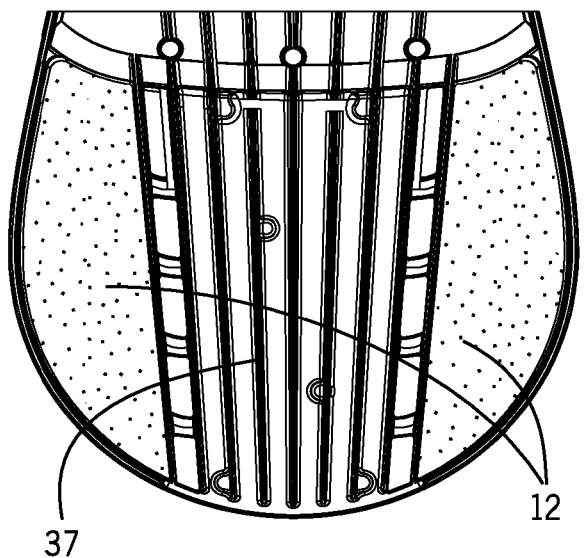
FIGS. 35-37 are schematic top plan views of the LED light fixture of FIG. 1, such figures serving to indicate particular projected areas of the fixture for purposes of facilitating description of certain aspects of the invention.
Figure 36:
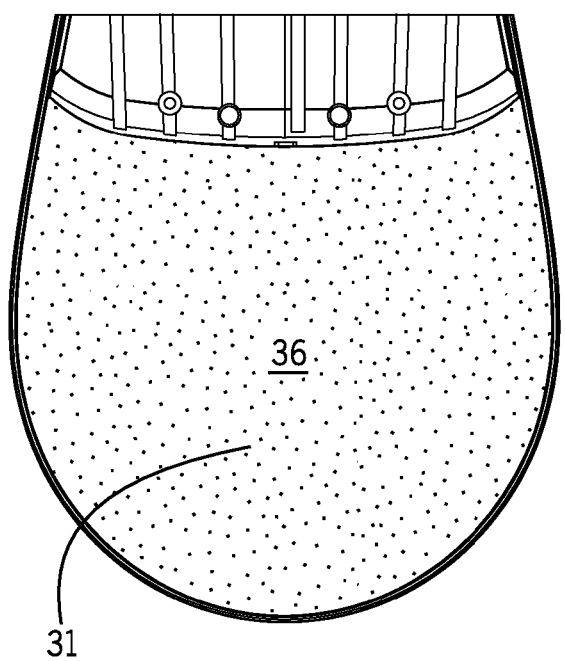
Figure 37:
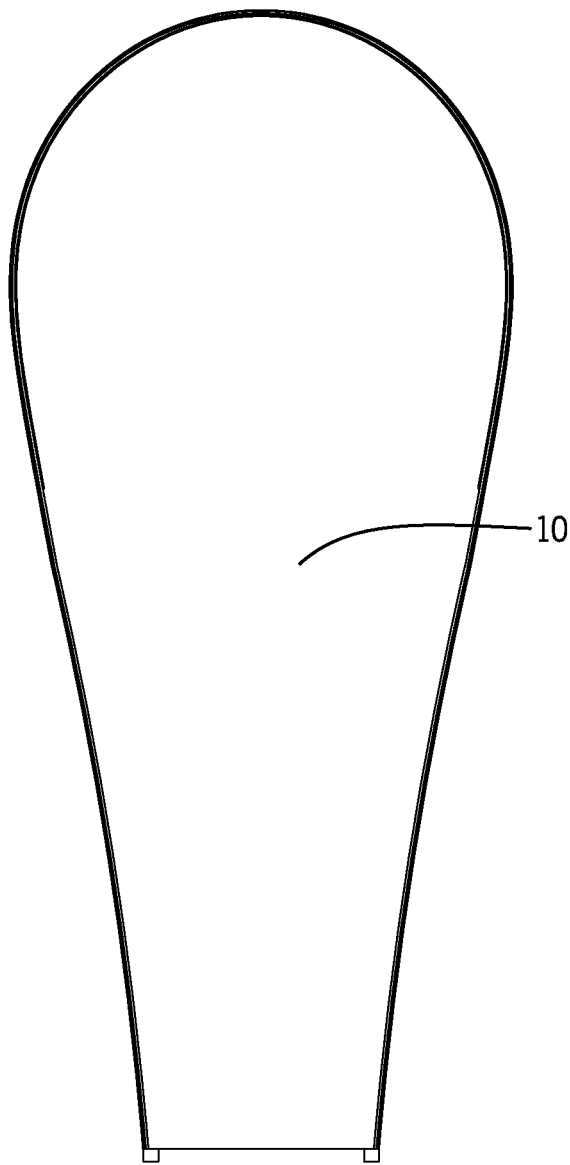
Figure 40:
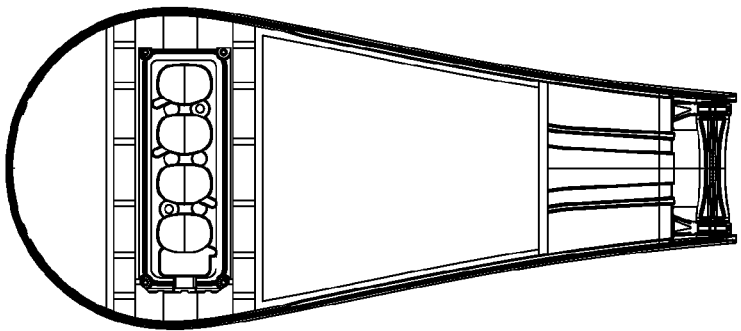
FIGS. 38-40 are bottom plan views of still alternative embodiments of the invention.
Figure 39:
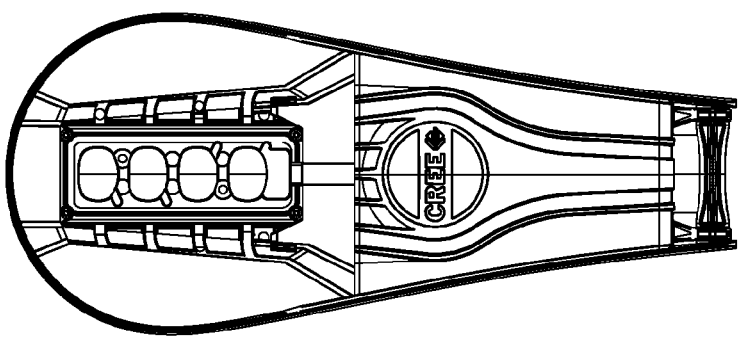
Figure 38:
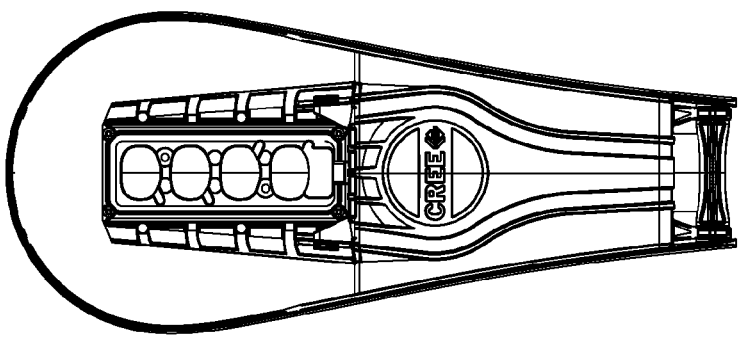
Figure 38A:
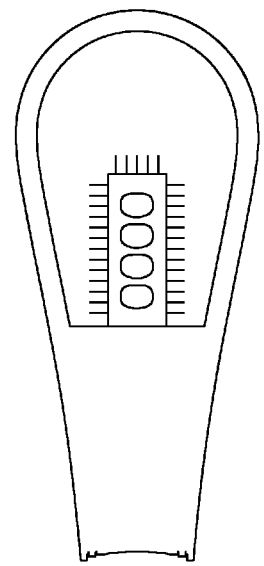
Figure 39A:
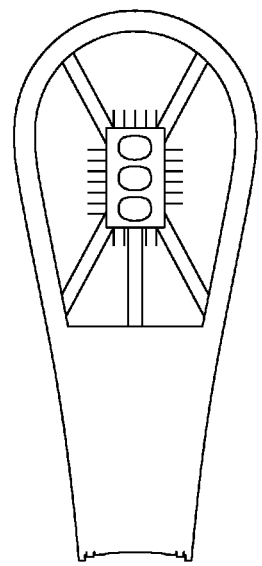
Figure 40A:
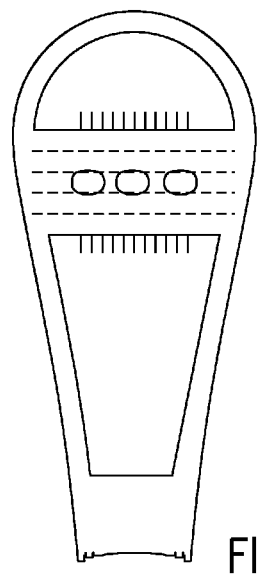

FIGS. 35-37 show projected LED-assembly area 37 of about 60% of the projected forward-region area 36. The total through-space area of the two lateral side voids 12 is about two-thirds of projected LED-assembly area 37.

When describing the openness aspect of this invention using reference to the illuminator plane P indicated in FIGS. 13 and 16, plane P is defined by LED illuminator 41 directly facing the area to be illuminated. The intersections referred to above with such plane P are illustrated in FIGS. 35 and 37.

Using such parameters, the total through-space area in the illuminator plane is slightly over 15% of the fixture area. And, if the light fixture is configured such that the enclosure with its LED power circuitry, rather than being beside the LED assembly, is offset above or otherwise away from the LED assembly (such as being in the support member), then the total through-space area in the illuminator plane may be at least about 40% of the fixture area. Described differently, the total through-space area in illuminator plane P is about two-thirds of the projected LED-assembly area.

While openness is discussed above with particular reference to the first embodiment, it should be noted that FIG. 20 illustrates an embodiment in which light fixture 10A has openness along the majority of its length. More specifically, the openness extends well to the rear of the forward portion of fixture 10A, i.e., well to the rear of the LED assembly of such fixture, including on either side of the enclosure.

Such openness in an LED light fixture offers great flexibility from the standpoint of form-factor design, e.g., allowing overall shape of the fixtures to better accommodate replacement of existing non-LED fixtures of various shapes. Several of the embodiments disclosed herein have frames which at least in their forward portions provide a footprint substantially similar to the footprint of so-called "cobrahead" light fixtures. This is achieved despite the fact that the LED assemblies used in fixtures according to the recent invention have substantially straight opposite lateral sides, as seen in the figures.

The advantages of the openness disclosed herein extend beyond form-factor concerns. Just one example includes avoiding or minimizing accumulation of snow, leaves or other materials on the fixtures.

Another aspect of the present inventive light fixtures is illustrated in FIGS. 1, 6, 7 and 11-13. Referring in particular to the first embodiment, central portion 45 of heat sink 42 has downwardly-extending shield members 65 at lateral sides 50 of heat sink 42. Shield members 65 are configured and dimensioned to block illumination which, when fixture 10 is installed as street-light, minimize upward illumination. This facilitates compliance with "dark-sky" requirements for limiting light pollution.

FIG. 16 shows that optical member 29 is configured for directing emitter light in preferential direction 2 toward the forward side. FIGS. 1, 6, 7, 11-14 and 16 show a downwardly-extending shield member 66 at rearward side 49 of central heat-sink portion 45. Shield member 66 is configured and dimensioned to block rearward illumination. Rearward shield member 66 extends to a position lower than the lowermost outer-surface portion 290 of optical member 29. Rearward shield member 66 may include a reflective coating redirecting rearward light.

FIGS. 1, 6, 7, 11-14 and 16 show that forward wall-portion 181 of housing main portion 171 partially defines rearward shield member 66. These figures also show cover-member forward end 351, which is secured to forward wall-portion 181 of housing body 176, partially defining rearward shield member 66. Reflective or white coating of housing 17 may provide reflective characteristics for redirecting rearward light toward the preferential forward side 2.

As seen in FIGS. 1, 5, 14 and 16, cover member 350 has a cover wall 354 extending between rearward and forward ends 352 and 351. Cover wall 354 includes a lowermost portion 354A which is at a position lower than lowermost position 66A of rearward shield member 66 to further block rearward illumination. Reflective or white coating of cover wall 354 may provide reflective characteristics for redirecting rearward light in useful direction.

In some prior LED devices, back-light shielding has been in the form of individual shields disposed on a non-preferential side of each LED emitter. Some of such prior shielding was positioned over the exterior of a corresponding lens. In such prior cases, over time the back-light shielding often became covered with dust or other ambient particles and simply absorbed rearward light from the respective LED emitter. Such absorption translated in decreased efficiency of light output from such LED device. In other examples, prior back-light shielding was positioned inside each lens corresponding to each individual LED emitter. While protected from contamination, such shielding resulted in lenses which were both complex and expensive to manufacture. In either type of the back-light shielding disposed on the non- preferential side of each individual LED emitter, there was still some undesired light in the rearward direction. Such light escaped the prior lens-shield configuration through unintended refraction or reflection by the lens.

In some other prior examples of back-light shielding used in light fixtures, such shields were in the form of a separate structure secured with respect to the fixture rearwardly to the illuminator. Such separate shielding structures often required complicated securement arrangements as well as interfered with the overall shape of the light fixture.

The integrated back-light shielding of the present invention, provides effective blocking of rearward light and reflection of such light away from areas of undesired illumination. The reflection provided by the integrated back-light shield of this invention facilitates higher light-output efficiency of the LED illuminator used in the LED light fixture of the present invention. The integrated nature of the back-light shielding of the present invention provides all the benefits of a single back-light shield without disruption of the overall shape of the fixture. Furthermore, the back-light shielding of the present invention is defined by surfaces which are open to air and water flow, which facilitates self cleaning of the reflective surface and minimized absorption of light received by such shield surface.

Another aspect of this invention is illustrated best in FIGS. 3-6, 8-10, 15-19, 21 and 22. These figures show an exterior fulcrum 90 of fixture 10 affixed to rearward portion 33 of the fixture. Fulcrum 90 is configured to pivotably engage one side 11A of support member 11 when a fixture-adjacent end 110 of support member 11 is within fixture interior 19. FIGS. 5, 6, 9, 16, 17 and 22 show that fixture 10 also includes an engager 91 secured within fixture interior 19 in position to engage the opposite side 11B of support member 11 at a position offset from fulcrum 90. This arrangement holds fixture 10 in the desired orientation when support member 11 is held between fulcrum 90 and engager 91.

Figure 9:
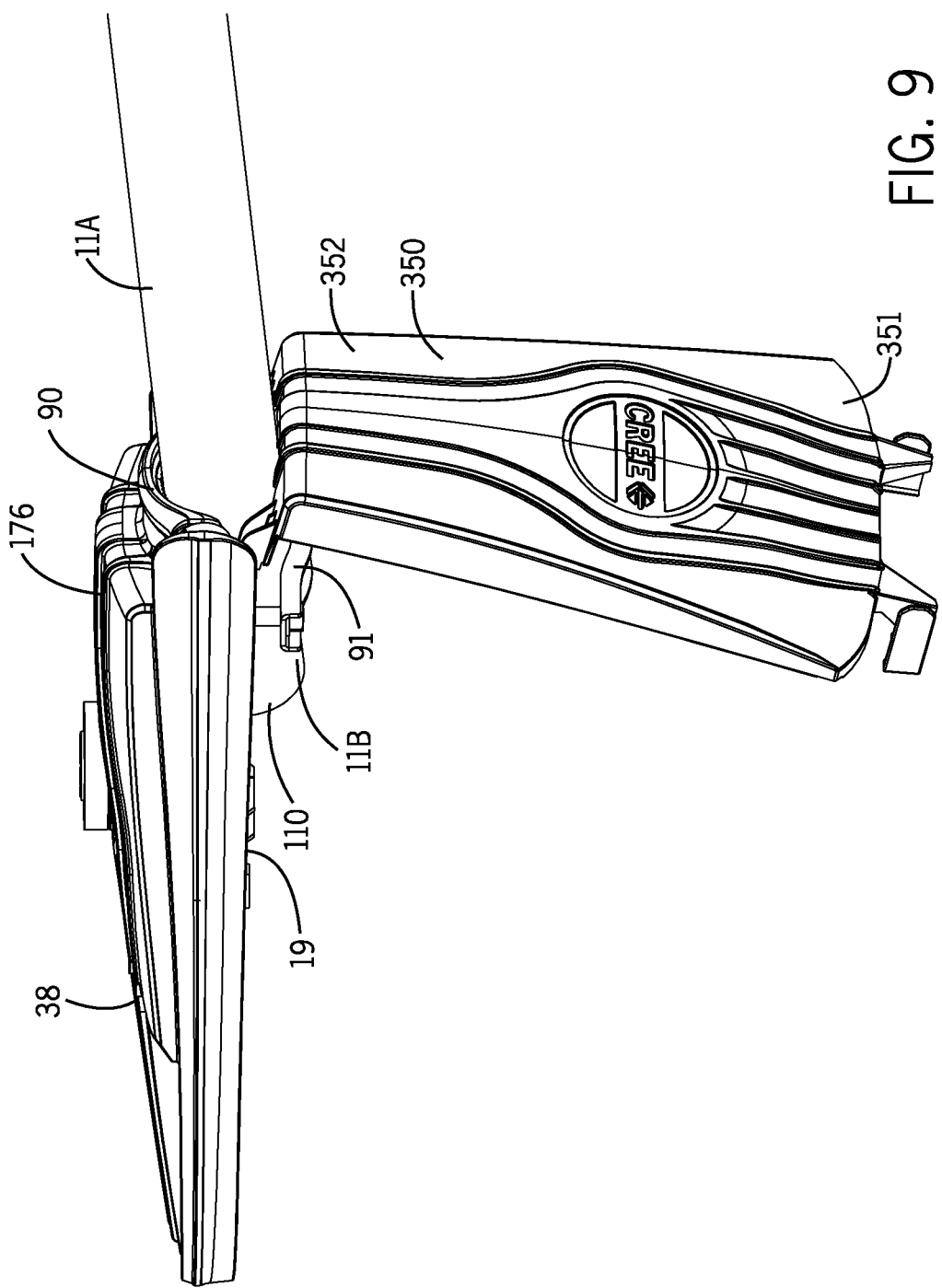
FIG. 9 is a side rear perspective view showing the LED light fixture secured with respect to a support member and having its cover member hanging open.
Figure 10:
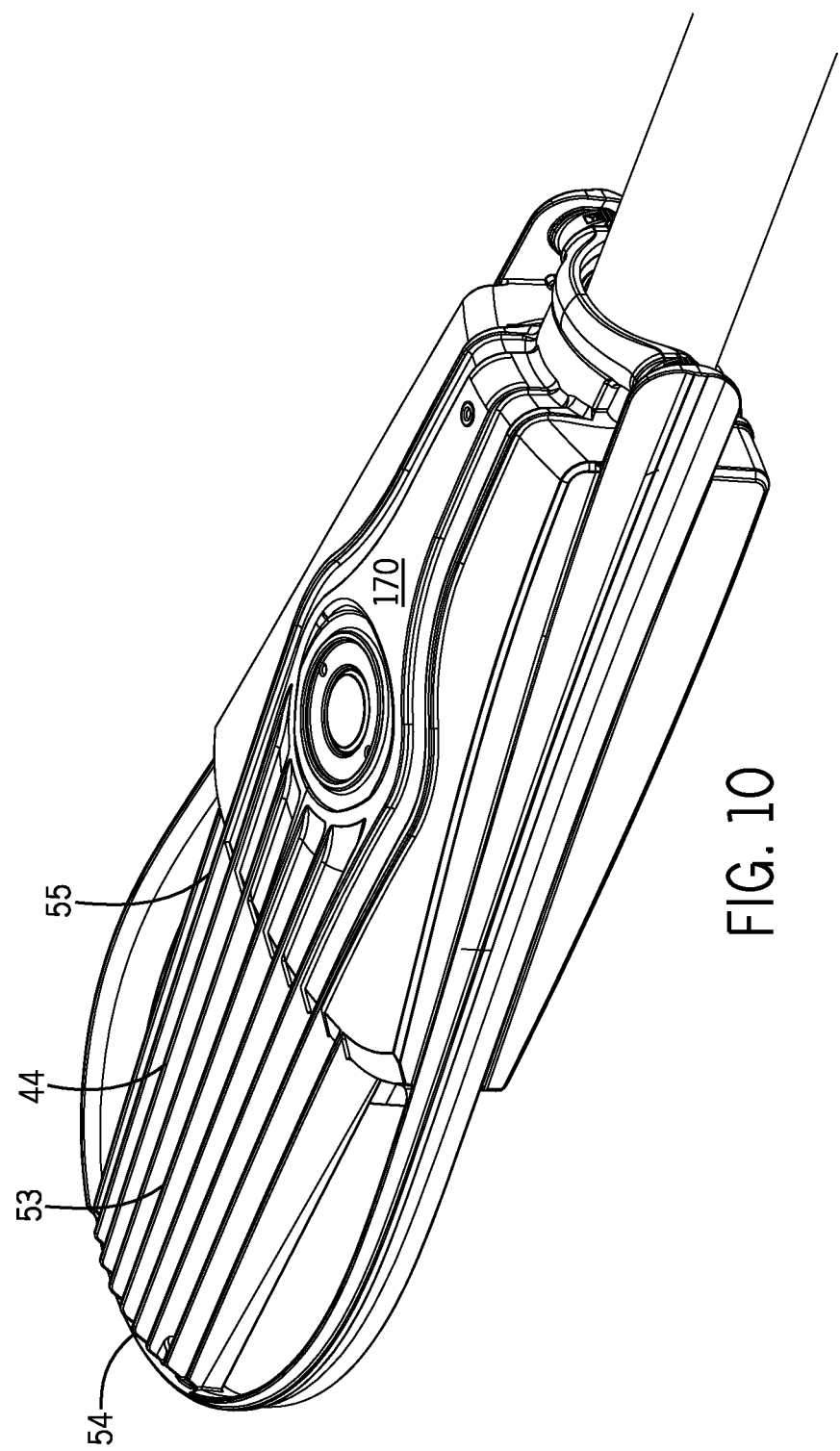
FIG. 10 is a top rear perspective view showing the LED light fixture secured with respect to the support.
Figure 11:
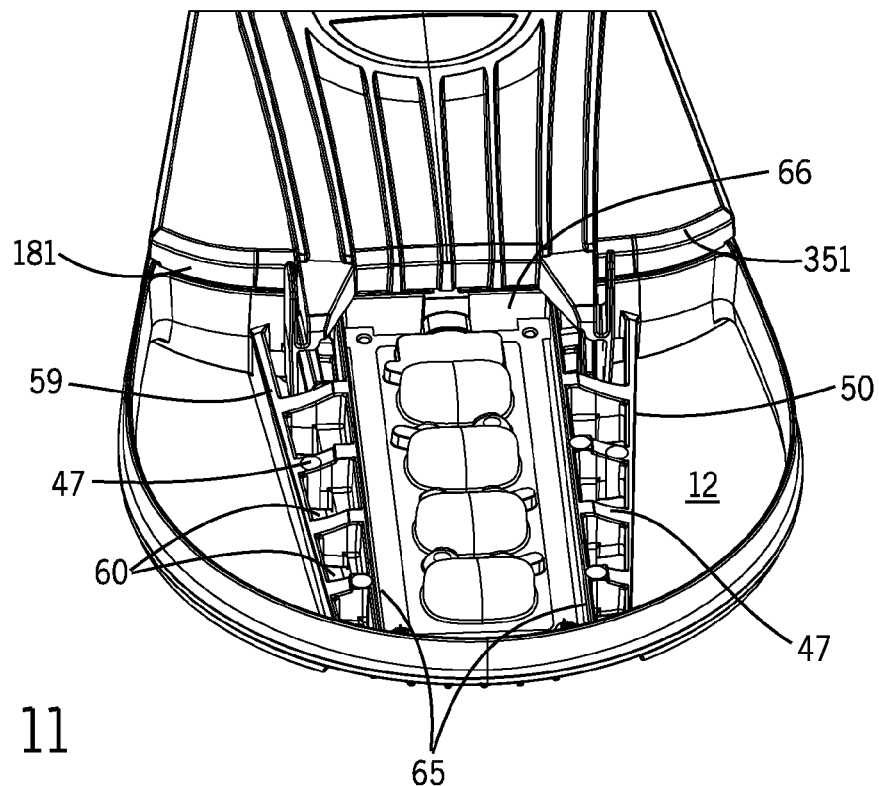
FIG. 11 is a fragmentary front perspective view from below illustrating the forward region of the fixture with its LED assembly therein, including its LED illuminator.
Figure 12:
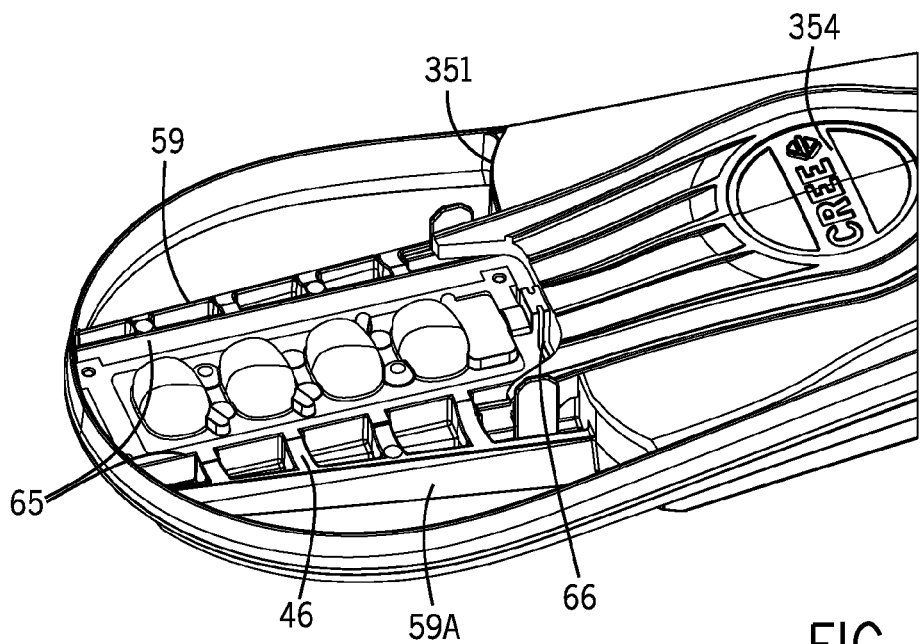
FIG. 12 is a fragmentary side perspective view from below showing the same portions of the fixtures as shown in FIG. 11 from a somewhat different angle.

FIGS. 8-10 show that fulcrum 90 is shaped to limit lateral movement of support member 11 thereagainst by its cradling shape and the fact that fulcrum 90 includes a row of teeth 92 configured to engage support member 11.

Fulcrum 90 is part of a fulcrum member 93 which also includes support structure 95 for fulcrum 90. FIGS. 3, 4, 8-10, 15, 18 and 19 show frame 30 having a pair of rearmost extensions 39 between which fulcrum 90 is secured. FIG. 10 also shows heat sink 42, frame 30, upper shell 34 and fulcrum 90 formed as a single piece.

The exterior fulcrum provides advantages such as allowing a smaller aperture for a support-member entry into the fixture interior 13 as well as easier access to the interior by providing more room for clearance of a compartment door. The smaller entry aperture may eliminate the need for a splash guard which is typically required for UL listed outdoor light fixtures, while still providing for the possibility of a splash-guard arrangements.

Figure 17:
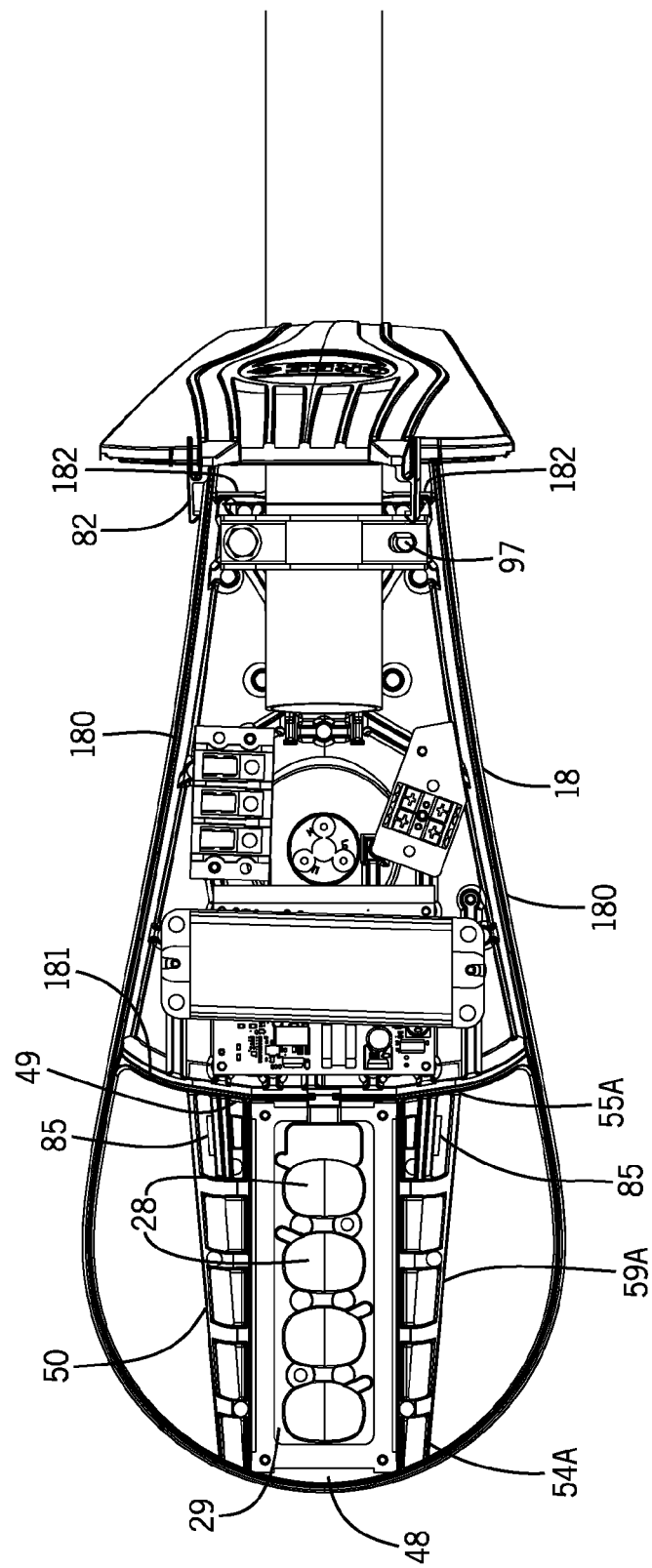
FIG. 17 is a bottom plan view of one embodiment of the LED light fixture secured to a support member and with its cover member open.
Figure 18:
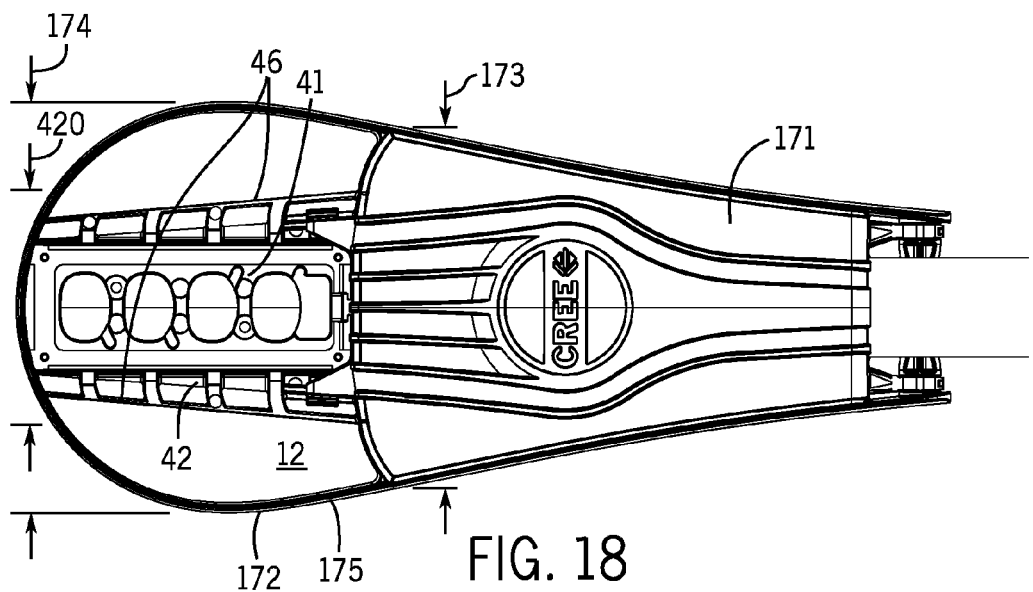
FIG. 18 is a bottom plan view similar to FIG. 17 but with the cover in its closed position.

As shown in FIGS. 6, 9 and 17, engager 91 is adjustably secured with respect to upper shell 34 and includes a yoke 96 shaped to substantially conform to the shape of support member 11. Yoke 96 has a pair of pin-receiving apertures 97 with a shaft portion 98A of a corresponding pin 98 extend therethrough into threaded engagement with upper shell 34.

FIGS. 16 and 17 show that fixture interior 19 has an angle-referencing region 340 shaped to engage fixture-adjacent end 110 of support member 11 in order to facilitate positioning of fixture 10 (with respect to support member 11) within one of plural predetermined angle ranges 342. FIG. 16 shows angle-referencing region 340 as a step-like configuration extending downwardly from upper shell 34. Steps 341 each correspond to one of the plural predetermined angle ranges such that, depending on which of steps 341 is selected for engagement by fixture-adjacent end 110 of support member 11, adjustment of engager 91 locks fixture 10 at a particular angle with respect to support member 11 within the range of the selected step 341. Such predetermined angle ranges are range 342A (which includes the range of about −5° to about −2.5°), range 342B (which includes the range of about −2.5° to about 0°), range 342C (which includes the range of about 0° to about +2.5°), range 342D (which includes the range of about +2.5° to less than about +5°), and range 342E (which includes the range of about +5°).

Figure 4:
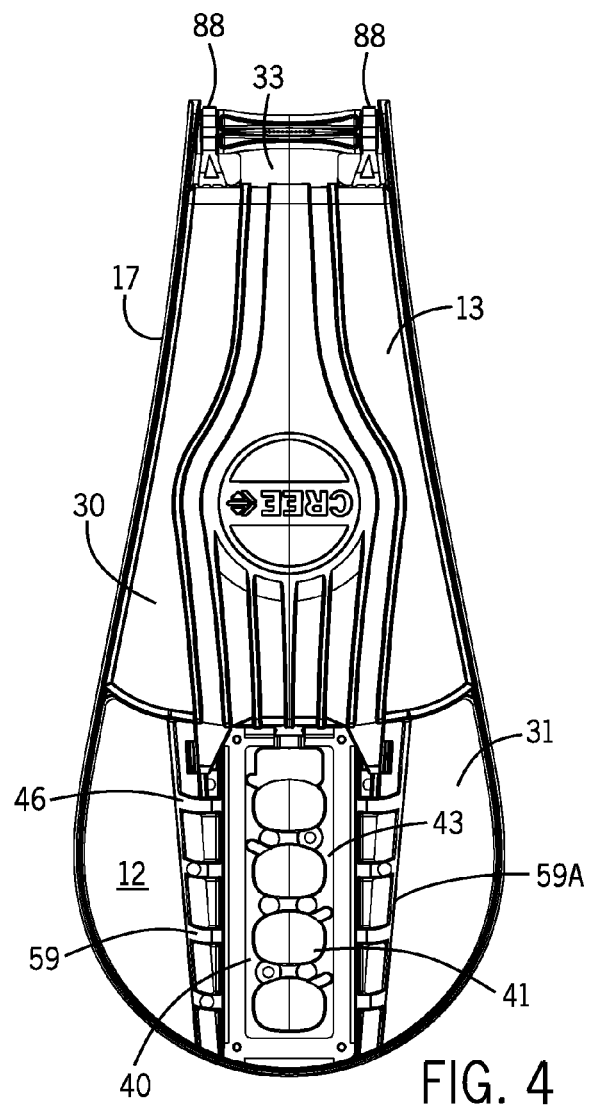
FIG. 4 is a bottom plan view of the LED light fixture of FIG. 1.

FIGS. 3 and 4 show light fixture 10 which in plan view has central and outward portions. The central portion includes housing 17 enclosing LED power circuitry, heat sink 42 secured with respect to housing 17 and supporting LED illuminator 40. The central portion also includes a mount adapted for securement to support member 11. As seen in FIGS. 3 and 4, outward portion defines an outer plan-view shape of fixture 10 and is secured to the central portion with through-space(s) 12 between the central and outward portions.

As further seen in FIGS. 3, 4, 18 and 19, through-spaces 12 are along heat sink 42 on opposite sides thereof. Through-spaces are shown along opposite sides of the central portion. FIG. 20 shows through-spaces 12 being along housing 17. The outward portion has an outer perimeter which in plan view may be substantially similar to the footprint of a cobrahead non-LED light fixture.

This invention gives great flexibility in providing LED light fixtures for a variety of particular roadway lighting and other similar outdoor lighting purposes. The desired light-output level determined by the particular application and/or determined by dimensional constraints (e.g., pole height, area to be illuminated, and desired foot-candles of illumination in the target area) can be varied substantially by selection of the particular appropriate LED illuminator and chosen power level, with or without modification of heat-sink size, without departing from a particular desired form factor, such as the above-mentioned "cobrahead" form. The open "footprint" of the fixture of this invention allows such flexibility in a light fixture with advantageous performance characteristics, both in light output and in heat dissipation.

One example of such light fixture is the fixture referred to as the first embodiment. Such particular fixture with a chosen four LED emitters and a heat sink as shown at power level of twenty-four watts gives an output of about 2411- 2574 lumens depending on LED correlated color temperature (CCT). The same fixture with applied power of forty-two watts gives an output of about 3631-3884 lumens again depending on LED CCT. Higher lumen outputs can be achieved by corresponding adjustments in the number and nature of LED emitters with or without corresponding adjustment of the heat sink. These changes can be made with or without change in the "footprint" of the fixture.

While the principles of the invention have been shown and described in connection with specific embodiments, it is to be understood that such embodiments are by way of example and are not limiting.

The invention clamed is:

1. An LED light fixture comprising:
    a peripheral frame defining a forward open region and a rearward region with a rearmost portion adapted for securement to a support member;
    an LED assembly secured with respect to the frame and positioned within the open forward region with open spaces remaining therebetween, the LED assembly comprising (a) a heat sink comprising an LED-supporting region and heat-dissipating surfaces extending therefrom and (b) an LED illuminator secured with respect to the LED-supporting region, the forward open region extending forwardly from the rearward region to the peripheral frame and being open thereacross but for the LED assembly; and
    an enclosure within the rearward region and defining a chamber enclosing electronic LED power circuitry.

2. The LED light fixture of claim 1 wherein the heat sink and the frame are formed as a single piece.

3. The LED light fixture of claim 1 wherein the enclosure has upper and lower shells, the upper shell and the frame being formed as a single piece.

4. The LED light fixture of claim 3 wherein the heat sink, the upper shell and the frame are formed as a single piece.

5. The LED light fixture of claim 4 wherein the single piece is a metal casting.

6. The LED light fixture of claim 5 wherein the lower shell is movably secured with respect to the upper shell, the lower shell being a one-piece polymeric structure.

7. The LED light fixture of claim 6 wherein the LED power circuitry comprises an antenna and circuitry for wireless control of the fixture, the antenna being fully enclosed within the chamber.

8. The LED light fixture of claim 1 wherein the heat sink is open to ambient fluid flow and comprises a central portion and peripheral portions, the central portion comprising the LED-supporting region, the peripheral portions having peripheral heat-dissipating surfaces along lateral sides of the heat sink.

9. The LED light fixture of claim 8 wherein the central portion has a plurality of fins protruding in a direction opposite the LED illuminator.

10. The LED light fixture of claim 9 wherein the heat sink comprises at least one central-portion venting aperture facilitating ambient-fluid flow to and from the heatdissipating surfaces of the central portion.

11. The LED light fixture of claim 9 wherein, in the mounted position, the central portion has between-fin surfaces which are inclined off-horizontal, thereby facilitating liquid drainage from the heat sink.

12. The LED light fixture of claim 8 wherein the peripheral heat-dissipating surfaces comprise a plurality of fins extending laterally from the central portion of the heat sink with open spaces between such fins.

13. The LED light fixture of claim 12 wherein the central portion has a plurality of fins extending forwardly from the central portion of the heat sink with open spaces between the fins.

14. The LED light fixture of claim 1 wherein:
    the enclosure has an upper shell and a lower shell movably secured with respect to the upper shell; and
    the electronic LED power circuitry comprises a caseless LED driver the components of which are encapsulated in a protective polymeric material, the driver being removably secured to the upper shell.

15. The LED light fixture of claim 14 wherein the lower shell is a polymeric structure.

16. The LED light fixture of claim 15 wherein the LED power circuitry comprises an antenna and circuitry for wireless control of the fixture, the antenna being fully enclosed within the chamber.

17. The LED light fixture of claim 15 wherein the heat sink, the upper shell and the frame are formed as a single piece.

18. The LED light fixture of claim 17 wherein the single piece is a metal casting.

19. The LED light fixture of claim 1 wherein the LED illuminator comprises an LED emitter on a circuit board and an LED optical member over the emitter.

20. The LED light fixture of claim 19 wherein the LED emitter comprises an array of LED light sources spaced along the circuit board.

21. The LED light fixture of claim 20 wherein the LED optical member comprises a plurality of lenses each over a corresponding one of the LED light sources.

22. The LED light fixture of claim 21 wherein each LED light source comprises an array of LEDs.

23. An LED light fixture comprising:
    a non-metallic frame having a peripheral forward portion defining a forward open region and having a rearward region defining a chamber enclosing electronic LED power circuitry, the rearward region having a rearmost portion adapted for securement to a support member; and an LED assembly secured with respect to the frame and positioned within the forward open region with open space extending from the LED assembly to the peripheral forward portion of the frame on opposite sides of the LED assembly, the LED assembly comprising (a) a heat sink comprising an LED supporting region and heat-dissipating surfaces extending therefrom and (b) an LED illuminator secured with respect to the LED-supporting region.

24. The LED light fixture of claim 23 wherein the frame has upper and lower shells.

25. The LED light fixture of claim 23 wherein the non-metallic frame is of a polymeric material.

26. The LED light fixture of claim 25 wherein the LED power circuitry comprises an antenna and circuitry for wireless control of the fixture, the antenna being fully enclosed within the chamber.

27. An LED light fixture comprising:
a frame having a forward peripheral portion defining a forward region of the fixture and further defining a projected forward-region area, the frame also defining a rearward region of the fixture, the rearward region having a rearmost portion adapted for securement to a support member; and
an LED assembly secured in the forward region with open space between the LED assembly and the forward peripheral portion of the frame, the LED assembly comprising a heat sink with an LED illuminator secured with respect thereto, the LED assembly defining a projected LED-assembly area which is no more than about 75% of the projected forward-region area.

28. The LED light fixture of claim 27 wherein the projected LED-assembly area is no more than about 60% of the projected forward-region area.

29. The LED light fixture of claim 27 wherein projected area of open space is at least about 50% of the projected LED-assembly area.

30. The LED light fixture of claim 29 wherein projected area of open space is at least about 60% of the projected LED-assembly area.

31. The LED light fixture of claim 30 wherein projected area of open space is about two-thirds of the projected LED-assembly area.

32. The LED light fixture of claim 27 wherein:
the LED assembly has substantially straight opposite lateral sides;
the open space comprises substantially minor-image areas on opposite lateral sides of the LED assembly; and
the frame has substantially curved outward edges defining the forward region in a footprint substantially similar to the footprint of a cobrahead non-LED light fixture.

33. The LED light fixture of claim 27 wherein the frame and the heat sink are formed as one piece.

34. An LED light fixture comprising:
a frame having an outer perimeter and including a rearward portion and a peripheral forward portion defining a forward open region, the fixture having a rearmost portion adapted for securement to a support member;
an LED assembly secured with respect to the frame and comprising a heat sink with an LED illuminator secured on the heat sink, the forward open region extending forwardly from rearward portion to the peripheral forward portion of the frame and being open thereacross but for the LED assembly, the LED illuminator defining an illuminator plane facing an area to be illuminated, the intersection of the LED assembly with the illuminator plane defining an LED-assembly area and the intersection of the outer perimeter with the illuminator plane defining a fixture area; and
one or more through-spaces in the fixture area such that total through-space area projected in the illuminator plane is at least about 15% of the fixture area.

35. The LED light fixture of claim 34 wherein the total throughspace area projected in the illuminator plane is at least about 40% of the fixture area.

36. The LED light fixture of claim 34 wherein the total throughspace area projected in the illuminator plane is at least about 50% of the LED-assembly area.

37. The LED light fixture of claim 36 wherein the total throughspace area projected in the illuminator plane is at least about 60% of the LED-assembly area.

38. The LED light fixture of claim 37 wherein the total throughspace area projected in the illuminator plane is about two-thirds of the projected LED-assembly area.

39. The LED light fixture of claim 34 wherein:
the LED assembly has substantially straight opposite lateral sides;
the one or more through-spaces comprise substantially mirror-image through-spaces on opposite lateral sides of the LED assembly; and
the frame has substantially curved outward edges defining the outer perimeter substantially similar to the footprint of a cobrahead non-LED light fixture.

40. An LED light fixture comprising:
a frame defining a forward open region and a rearward region with a rearmost portion adapted for securement to a support member;
an LED assembly secured with respect to the frame and positioned within the open forward region with open spaces remaining therebetween, the LED assembly comprising
a heat sink comprising an LED-supporting region and heat-dissipating surfaces extending therefrom open to ambient air flow, the heat sink comprising (i) a central portion having the LED-supporting region and a plurality of fins protruding in a direction opposite the LED illuminator, (ii) peripheral portions having heat-dissipating surfaces along lateral sides of the heat sink, and (iii) at least one central-portion venting aperture facilitating ambient-fluid flow to and from the heat-dissipating surfaces of the central portion, the fins of the central portion defining horizontal between-fin channels open at front fin-ends, the rear fin-ends being configured to permit ambient-fluid flow from the between-fin channels to the at least one centralportion aperture, thereby facilitating liquid drainage therefrom, and
an LED illuminator secured with respect to the LED-supporting region; and
an enclosure within the rearward region and defining a chamber enclosing electronic LED power circuitry.

41. The LED light fixture of claim 40 wherein the at least one central-portion venting aperture is/are adjacent to the enclosure.

42. An LED light fixture comprising:
a frame defining a forward open region and a rearward region with a rearmost portion adapted for securement to a support member;

an LED assembly secured with respect to the frame and positioned within the open forward region with open spaces remaining therebetween, the LED assembly comprising
- a heat sink comprising an LED-supporting region and heat-dissipating surfaces extending therefrom and open to ambient air flow, the heat sink comprising a central portion comprising the LED-supporting region and peripheral portions having peripheral heat-dissipating surfaces along lateral sides of the heat sink, the peripheral heat-dissipating surfaces including a plurality of fins extending laterally from the heat-sink central portion with open spaces therebetween, the heat sink being an extrusion which was extruded in a direction orthogonal to both the forward and lateral directions, the extruded dimension of the heat sink being substantially less than the forward-rearward and side-to-side dimensions of the heat sink, and
- an LED illuminator secured with respect to the LED-supporting region; and an enclosure within the rearward region and defining a chamber enclosing electronic LED power circuitry.

43. The LED light fixture of claim 42 wherein:

the central portion of the extrusion comprises walls defining a central opening in the extrusion; and in addition to the extrusion, the heat sink comprises a mounting plate in thermal contact with the extrusion, the LED illuminator being secured to the mounting plate.

\* \* \* \* \*